US012772567B2

(12) United States Patent
Zhou et al.

(10) Patent No.: US 12,772,567 B2
(45) Date of Patent: Oct. 20, 2026

(54) METAL INSULATOR METAL CAPACITOR BETWEEN TWO STACKED TRANSISTORS SEPARATED BY AN INSULATOR

(71) Applicant: INTERNATIONAL BUSINESS MACHINES CORPORATION, Armonk, NY (US)

(72) Inventors: Huimei Zhou, Albany, NY (US); Shahrukh Khan, Sandy Hook, CT (US); Baozhen Li, South Burlington, VT (US); Ruilong Xie, Niskayuna, NY (US); Yoo-Mi Lee, Montvale, NJ (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 490 days.

(21) Appl. No.: 18/466,871

(22) Filed: Sep. 14, 2023

(65) Prior Publication Data

US 2025/0098322 A1 Mar. 20, 2025

(51) Int. Cl.
*H10D 86/80* (2025.01)
*H10D 86/01* (2026.01)
(Continued)

(52) U.S. Cl.
CPC ............. *H10D 86/80* (2025.01); *H10D 86/01* (2025.01); *H10D 86/0214* (2025.01);
(Continued)

(58) Field of Classification Search
CPC ...... H10D 30/501; H10D 30/67; H10D 86/80; H10D 86/01; H10D 86/481; H10D 87/00; H10D 1/68
See application file for complete search history.

(56) References Cited

U.S. PATENT DOCUMENTS 9,870,939 B2 1/2018 Linewih
10,157,935 B2 12/2018 Cheng
(Continued)

OTHER PUBLICATIONS

Mclellan, "Imec Roadmap", Jun. 7, 2018, Imec Roadmap—Breakfast Bytes—Cadence Blogs—Cadence Community, https://community.cadence.com/cadence_blogs_8/b/breakfast-bytes/posts/imec2, 10 pages.
(Continued)

*Primary Examiner* — John P. Dulka
(74) *Attorney, Agent, or Firm* — Kimberly Zillig

(57) ABSTRACT

A semiconductor device including a first stacked nanosheet Field Effect Transistor (FET), a second stacked nanosheet, a metal insulator metal (MIM) capacitor between the first stacked nanosheet and the second stacked nanosheet and an insulator separating the MIM capacitor from each of the first stacked nanosheet and the second stacked nanosheet. An embodiment where the first stacked nanosheet and the second stacked nanosheet each include an upper stacked nanosheet and a lower stacked nanosheet, the upper stacked nanosheet and the lower stacked nanosheet each include alternating layers of a sacrificial material and a semiconductor channel material vertically aligned and stacked one on top of another. Forming a first stacked nanosheet, forming a second stacked nanosheet, forming a MIM capacitor between the first stacked nanosheet and the second stacked nanosheet and forming an insulator separating the MIM capacitor from each of the first stacked nanosheet and the second stacked nanosheet.

20 Claims, 34 Drawing Sheets

Section X-X

(51) Int. Cl.

| | |
|---|---|
| ***H10D 86/40*** | (2025.01) |
| ***H10D 86/60*** | (2025.01) |
| ***H10D 87/00*** | (2026.01) |

(52) U.S. Cl.

CPC ........... *H10D 86/481* (2025.01); *H10D 86/60* (2025.01); *H10D 87/00* (2025.01); *H10D 86/421* (2025.01)

(56) References Cited

U.S. PATENT DOCUMENTS

| | | | |
|---|---|---|---|
| 10,170,548 | B2 | 1/2019 | Cheng |
| 10,693,450 | B2 | 6/2020 | Nedalgi |
| 11,404,534 | B2 | 8/2022 | Kao |
| 11,500,614 | B2 | 11/2022 | Hekmatshoartabari |
| 2010/0230735 | A1 | 9/2010 | Zhu |
| 2024/0113101 | A1 * | 4/2024 | Dutta ..................... H10D 30/47 |

OTHER PUBLICATIONS

Prasad et al., "Buried Power rails and back-side Power Grids: Arm® CPU Power Delivery Network Design Beyond 5nm", © 2019 IEEE, IEDM19, p. 19.1.1-19.1.4.

* cited by examiner

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section X-X

Section X-X

METAL INSULATOR METAL CAPACITOR BETWEEN TWO STACKED TRANSISTORS SEPARATED BY AN INSULATOR

BACKGROUND

The present invention relates, generally, to the field of semiconductor manufacturing, and more particularly to a metal-insulator-metal (MIM) capacitor.

MIM capacitors are a key element for integration of system-on-chips, improving both circuit performance and down-scaling capability. A typical MIM capacitor includes a top metal electrode, a dielectric/insulator layer and a bottom metal electrode. Voltage is applied across the metal electrodes which results in charge storage within the formed capacitor configuration. MIM capacitors are used in functional circuits such as mixed signal circuits, analog circuits, radio frequency (RF) circuits, dynamic random access memory (DRAM), embedded DRAM, and logic operation circuits.

The MIM capacitor is usually embedded into upper back-end-of-the-line (BEOL) layers. Traditional methods of fabricating a MIM capacitor include stacking of multiple MIM capacitor layers that involve numerous lithography and etching steps. Some MIM capacitor designs, require many extra processing steps that may not be easily integrable into a conventional BEOL process. A complexity of current MIM capacitor fabrication methods can cause problems during the semiconductor manufacturing process that can hinder capacitance density increase and yield improvement.

SUMMARY

According to an embodiment of the present invention, a semiconductor device is provided. The semiconductor device including a first stacked nanosheet Field Effect Transistor (FET), a second stacked nanosheet, a metal insulator metal (MIM) capacitor between the first stacked nanosheet and the second stacked nanosheet and an insulator separating the MIM capacitor from each of the first stacked nanosheet and the second stacked nanosheet.

According to an embodiment of the present invention, a semiconductor device is provided. The semiconductor device including a first stacked nanosheet, a second stacked nanosheet, a metal insulator metal (MIM) capacitor between the first stacked nanosheet and the second stacked nanosheet and an insulator separating the MIM capacitor from each of the first stacked nanosheet and the second stacked nanosheet, where the first stacked nanosheet and the second stacked nanosheet each include an upper stacked nanosheet and a lower stacked nanosheet, where the upper stacked nanosheet and the lower stacked nanosheet each include alternating layers of a sacrificial material and a semiconductor channel material vertically aligned and stacked one on top of another.

According to an embodiment of the present invention, a method is provided. The method including forming a first stacked nanosheet, forming a second stacked nanosheet, forming a metal insulator metal (MIM) capacitor between the first stacked nanosheet and the second stacked nanosheet and forming an insulator separating the MIM capacitor from each of the first stacked nanosheet and the second stacked nanosheet.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
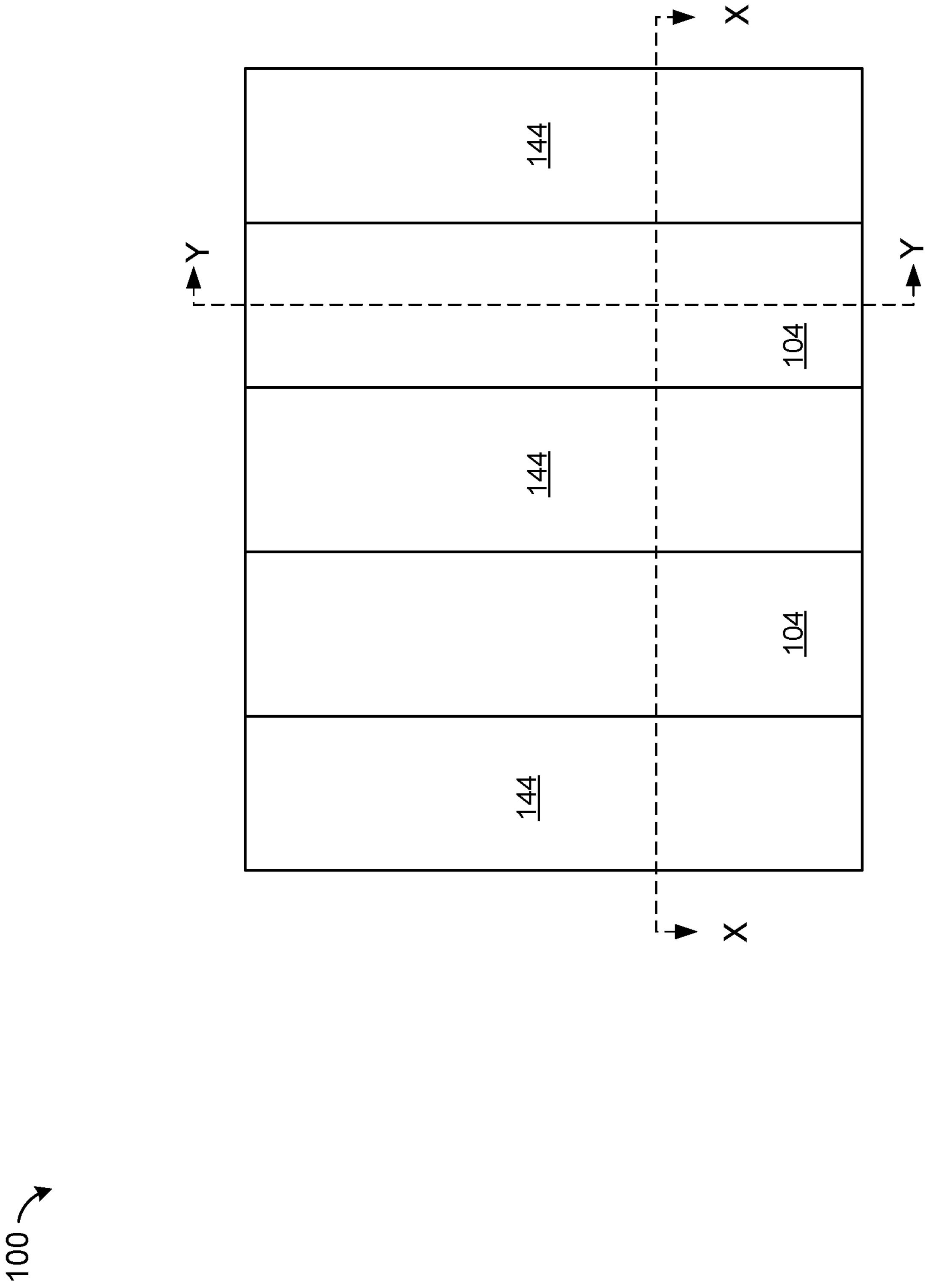
FIG. 1 illustrates a top view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms “upper”, “lower”, “right”, “left”, “vertical”, “horizontal”, “top”, “bottom”, and derivatives thereof shall relate to the disclosed structures and methods, as oriented in the drawing figures. The terms “overlying”, “atop”, “on top”, “positioned on” or “positioned atop” mean that a first element, such as a first structure, is present on a second element, such as a second structure, wherein intervening elements, such as an interface structure may be present between the first element and the second element. The term “direct contact” means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to a metal-insulator-metal (hereinafter “MIM”) capacitor.

A field effect transistor (hereinafter “FET”) may be used as a capacitor for various functions in digital and analog circuits. There are some negative effects of using a FET as a capacitor. A first negative effect is that the capacitance of an FET varies nonlinearly depending on a bias applied to the FET. A second negative effect of using an FET as a capacitor is that this requires a large portion of real estate of the semiconductor device.

A MIM capacitor is formed by adding extra masks between the wire metal layers. The MIM capacitor has advantages over an FET capacitor. A first advantage is the MIM capacitor has constant capacitance constant over a varied applied input voltage. A second advantage is the MIM capacitor has a highly linear nature and dynamic range. The highly linear nature of the MIM capacitor means that capacitance will not change based on bias. An FET capacitor changes value with bias. This is a greater benefit for circuit design and modeling of functionality of the whole circuit.

The capacitance density MIM capacitor may have a compatible capacitance compared to an FET capacitor. A capacitance density is a capacitance divided by area. The MIM capacitor is formed at a high BEOL level, requiring a large process overhead. A large process overhead means high parallel capacitance during entirety of BEOL process steps and higher metal levels.

When a MIM capacitor is formed at a high level of the BEOL, there may be additional or parallel capacitance due to wiring, which can affect functionality of a circuit. Parallel capacitance is un-intended capacitance. By having the MIM capacitor adjacent to other electronic components of a circuit, there is less parallel capacitance.

In this invention, the MIM capacitor is placed adjacent to normal function FETs of the semiconductor device. Placing the MIM capacitor close to the normal function FETs improves alternating current (AC) performance by providing a lower parallel resistance from the whole BEOL, and providing an improvement on area scaling to increase capacity density.

In this invention, a trench is formed between adjacent nanosheet stacks. The MIM capacitor is formed in the trench. The MIM capacitor may be formed between either adjacent single nanosheet stacks or may be formed between adjacent double nanosheet stacks and may be surrounded by an insulator.

The MIM capacitor may be formed between a first and a second nanosheet stack. A first terminal or contact to the MIM capacitor may be connected to upper wiring of a semiconductor device, above a nanosheet FET. A second terminal or contact to the MIM capacitor may be connected through an N-well below the MIM capacitor, under the second nanosheet stack, and connected to a source drain between the second nanosheet stack and a third nanosheet stack. Alternatively, the second terminal or contact to the MIM capacitor may be a backside contact. The first and second terminals or contacts may also be referred to as an anode and a cathode.

An advantage of forming the MIM capacitor in a trench between adjacent normal function devices includes improved performance of the normal function devices due to the proximity of the MIM capacitor. An additional advantage is a high capacitance density of the MIM capacity in a trench between adjacent normal function devices, and a third advantage is lower sensitivity to process defects such as shorts.

The MIM capacitor in a trench between stacked nanosheet FET has a high capacity due to a large surface area over a height of the MIM capacitor. The height of the MIM capacitor can be greater than a height of the stacked nanosheet FET.

The present invention relates, generally, to the field of semiconductor manufacturing, and more particularly to a metal-insulator-metal (MIM) capacitor.

Figure 2:
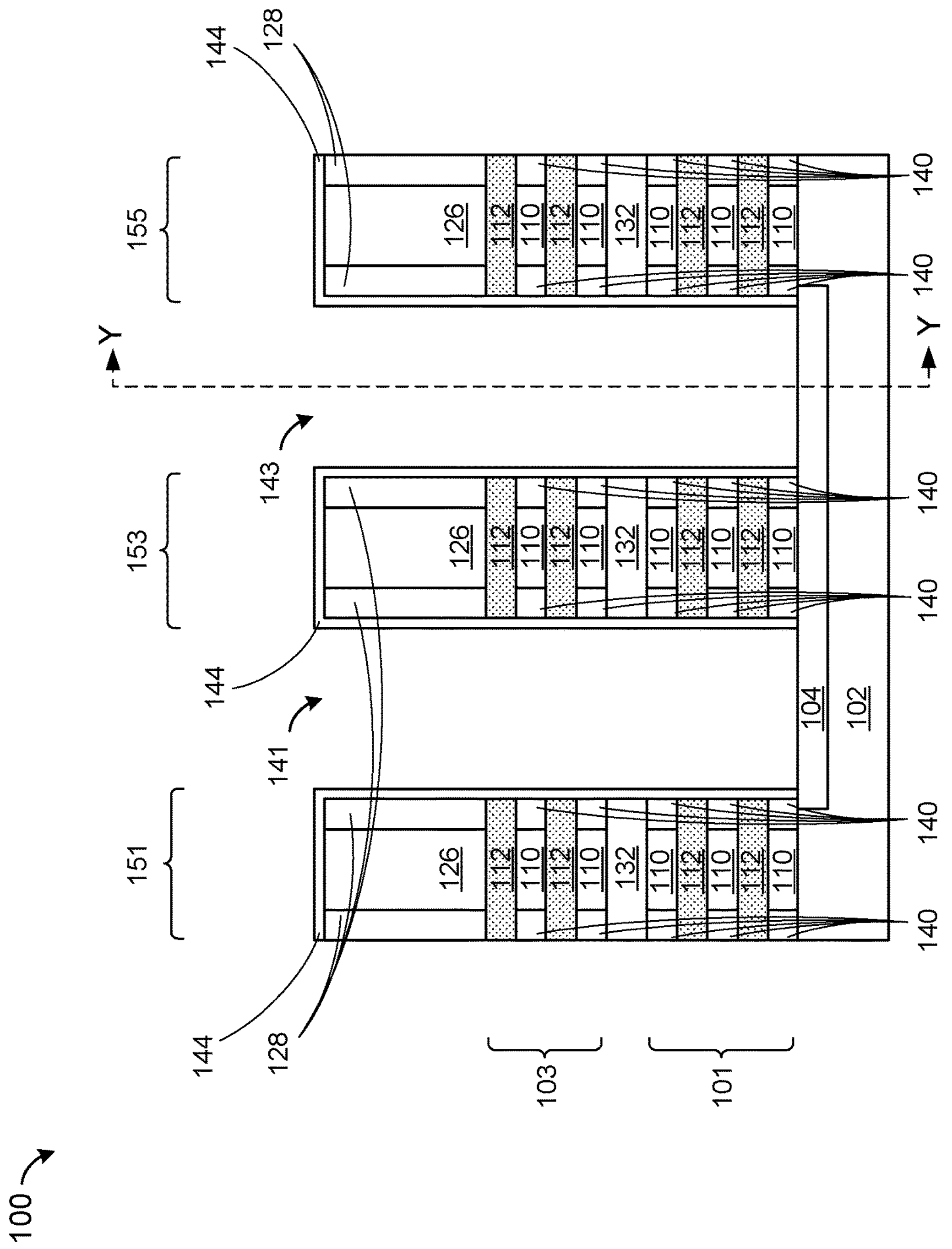
FIGS. 2 and 3 each illustrate a cross-sectional view of the semiconductor structure, along section lines X-X and Y-Y, respectively, according to an exemplary embodiment.
Figure 3:
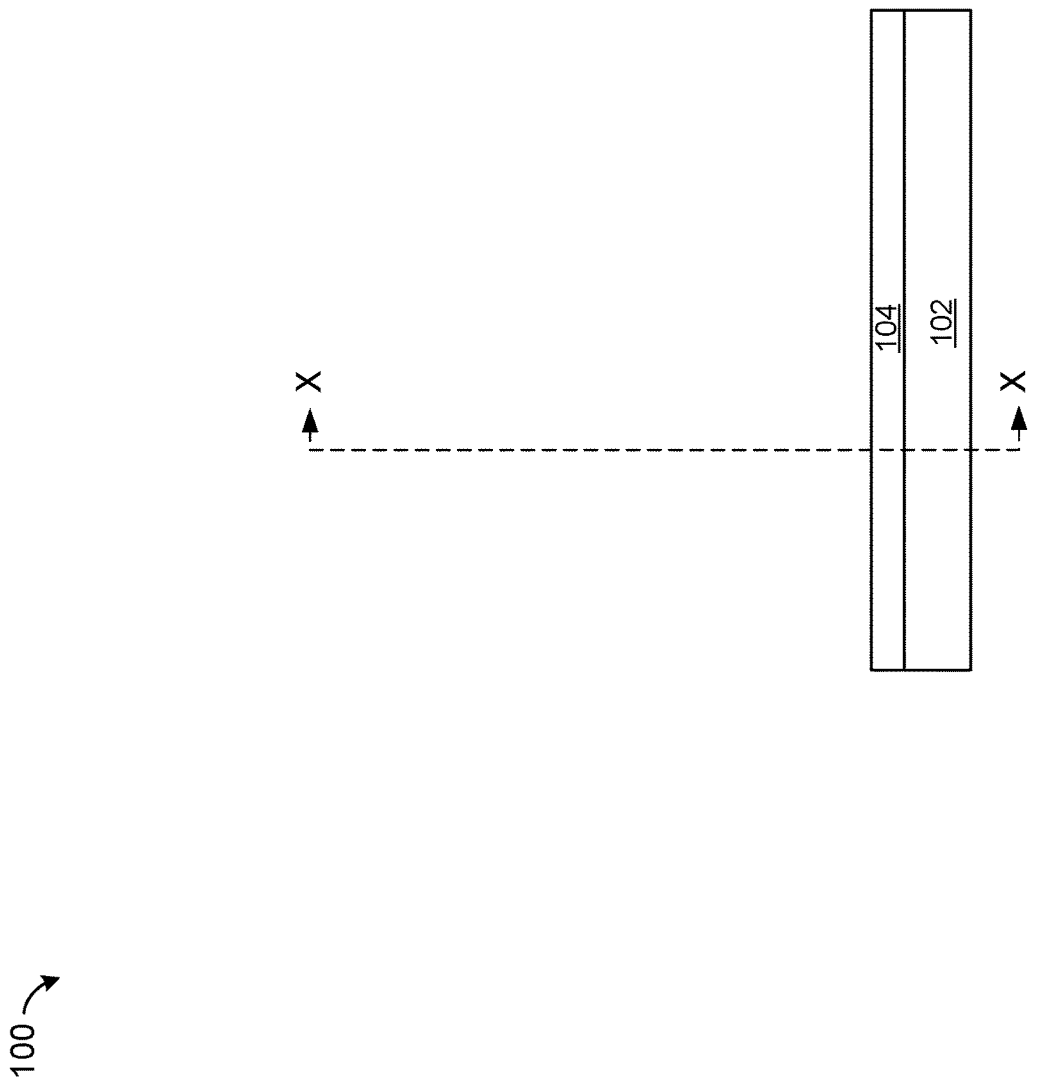

Referring now to FIGS. 1, 2 and 3, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X-X. FIG. 3 is a cross-sectional view of the structure 100 along section line Y-Y. FIGS. 2 and 3 are perpendicular to each other. The structure 100 may be formed or provided.

Several steps have been completed to form the structure 100 of FIGS. 1, 2, 3. The structure 100 may include a substrate 102, an N-well 104, a sacrificial semiconductor material layer (hereinafter "sacrificial layer") 110, a semiconductor channel material layer 112 (hereinafter "channel layer"), a middle dielectric isolation layer 132 and an insulator 144. The structure 100 may have an upper nanosheet stack 103 and a lower nanosheet stack 101. Three nanosheet stacks are illustrated, nanosheet stack 151, nanosheet stack 153 and nanosheet stack 155. The nanosheet stacks 151, 153 have a trench 141 between them. The nanosheet stacks 153, 155 have a trench 141 between them. There may be any number of nanosheet stacks on the structure 100.

The structure 100 may have had alternating layers of sacrificial layer 110 and channel layer 112 stacked one on top of another on the substrate 102. The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer. The substrate 102 may have the N-well 104 embedded in the substrate 102.

The nanosheet stack 151 may be positioned above a portion of the N-well 104. The trench 141 may be above the N-well 104, the nanosheet stack 153 may be entirely above the N-well 104, the trench 143 may be entirely above the N-well 104 and the nanosheet stack 155 may be positioned above a portion of the N-well 104. The N-well 104 may be formed by selective positioning of N+ implant on the substrate 102.

The N-well 104 may provide a contact to an outer metal plate of a to be fabricated Metal-Insulator-Metal (MIM) capacitor. The N-well 104 may be positioned below a trench, such as the trench 141, which will have a subsequently fabricated MIM capacitor, and below a nanosheet stack, such as the nanosheet stack 153, and connect to a subsequently fabricated lower source drain in the trench 143.

The alternating layers of sacrificial layer 110 and channel layer 112 may have included a sacrificial layer 110 covered by a channel layer 112, covered by a sacrificial layer 110, covered by a channel layer 112, covered by a sacrificial layer 110, covered by a stack sacrificial semiconductor material layer (not shown), covered by a sacrificial layer 110, covered by a channel layer 112, covered by a sacrificial layer 110, covered by a channel layer 112, covered by a sacrificial layer 110, covered by a covered by a channel layer 112. It should be noted that, while a limited number of alternating layers are depicted, any number of sacrificial layers 110 and channel layers 112 may be formed.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RTCVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 110, is composed of a first semiconductor material which differs in composition from at least an upper portion of the substrate 102 and the channel layer 112. In an embodiment, each sacrificial layer 110, may be a silicon-germanium semiconductor alloy and have a germanium concentration less than 50 atomic percent. In another example, each sacrificial layer 110, may have a germanium concentration ranging from about 20 atomic percent to about 40 atomic percent. Each sacrificial layer (not shown) can be formed using known deposition techniques or an epitaxial growth technique as described above.

Each channel layer 112 is composed of a second semiconductor material which differs in composition from at least the upper portion of the substrate 102 and the sacrificial layer 110. Each channel layer 112 has a different etch rate than the first semiconductor material of sacrificial layer 110. The second semiconductor material can be, for example, silicon. The second semiconductor material, for each channel layer 112 can be formed using known deposition techniques or an epitaxial growth technique as described above.

The alternating layers of sacrificial layer 110 and the channel layers 112 can be formed by sequential epitaxial growth of alternating layers of the first semiconductor material and the second semiconductor material.

The sacrificial layers 110 may have a thickness ranging from about 5 nm to about 15 nm, and the channel layers 112 may have a thickness ranging from about 3 nm to about 15 nm. Each sacrificial layer (not shown) may have a thickness that is the same as, or different from, the thickness of each channel layer 112. In an embodiment, each sacrificial layer 110 has an identical thickness. In an embodiment, each channel layer 112 has an identical thickness.

The alternating layers of sacrificial layers (not shown), channel layers 112 and stack sacrificial layer (not shown) may be formed into nanosheet fins, by methods known in the arts and include steps such as forming a hard mask (not shown) on the alternating layers, patterning the hard mask (not shown). The hard mask (not shown) may be removed.

The upper nanosheet stack 103 may include an area surrounding channel layers 112 above the stack sacrificial layer (not shown). The lower nanosheet stack 101 may include an area surrounding channel layers 112 below the stack sacrificial layer (not shown).

The lower nanosheet stack 101 can include any number of channel layers 112. The upper nanosheet stack 103 can include any number of channel layers 112. The nanosheet stack of the upper nanosheet stack 103 is vertically aligned above the nanosheet stack of the lower nanosheet stack 101 and is used to produce a gate all around device that includes vertically stacked semiconductor channel material nanosheets for a pair of stacked field effect transistors (hereinafter "FET"). In an embodiment, the lower nanosheet stack 101 may be an n-FET region and the upper nanosheet stack 103 may be a p-FET region. In an alternate embodiment, the lower nanosheet stack 101 may be a p-FET region and the upper nanosheet stack 103 may be an n-FET region. Alternatively, both the upper nanosheet stack 103 and the lower nanosheet stack 101 may be p-FET or may both be n-FET. In an embodiment, there may be only a lower nanosheet stack 101 which can be either an n-FET region or a p-FET region.

The sacrificial gate 126 is formed orthogonal (perpendicular) to the nanosheet stacks. The sacrificial gate 126 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 126 can include any material including, for example, polysilicon, amorphous silicon, or multilayered combinations thereof. The sacrificial gate (not shown) can be formed using any deposition technique including, for example, chemical vapor deposition (CVD), physical vapor deposition (PVD), high density plasma (HDP) deposition, and spin on techniques. Optionally, a gate dielectric layer (not shown) and a gate cap (not shown) may be formed as part of the sacrificial gate (not shown) in accordance with known techniques.

In an embodiment, the sacrificial gate 126 is deposited with a thickness sufficient to fill, or substantially fill, the spaces between adjacent nanosheet structures and cover horizontal upper surfaces of the substrate 102 and the N-well 104. The sacrificial gate 126 may be adjacent to vertical side surfaces of the nanosheet stack. The sacrificial gate 126 may cover an upper horizontal surface of an uppermost channel layer 112 of the nanosheet stack. A height of the sacrificial gate (not shown) may be much thicker than the underlying structure and may have a height between 100 nm and 150 nm about the nanosheet stack. A gate cap (not shown) may cover an upper horizontal surface and a vertical side surface of the sacrificial gate (not shown).

The stack sacrificial layer (not shown) and portions of the sacrificial layers 110 may be selectively removed using known techniques and may be done concurrently or sequentially. For example, a wet or dry etch process can be used with the appropriate chemistry to remove portions of each of the sacrificial layers 110. The material used for the etching process may be selective such that the channel layers 112, the sacrificial gate 126, the N-well 104 and the substrate 102 remain and are not etched. After etching, portions of the sacrificial layers 110 covered on opposite sides by the sacrificial gate 126 may remain as part of the nanosheet stack. In such cases, the sacrificial gate 126 supports the remaining channel layers 112 of the nanosheet stack.

The gate side spacers 128, the side spacers 140 and the middle dielectric isolation layer 132 are formed by a conformal dielectric deposition and anisotropic dielectric etching process. The gate side spacers 128, the side spacers 140 and the middle dielectric isolation layer 132 may be formed concurrently or sequentially. The gate side spacers 128 surround vertical side surfaces of the sacrificial gate 126. A lower horizontal surface of the gate side spacer 128 may be an upper horizontal surface of an uppermost channel layer 112. The side spacers 140 may fill a space where the portions of the sacrificial layers 110 were removed. The gate side spacers 128 may have a vertical side surface aligned with vertical side surfaces of the channel layers 112 and of the side spacers 140. The gate side spacers 128 may have a vertical side surface adjacent to a vertical side surface of the sacrificial gate 126. The middle dielectric isolation layer 132 may be formed where the stack sacrificial layer (not shown) was removed. The middle dielectric isolation layer 132 may have a vertical side surface aligned with vertical side surfaces of the channel layers 112 and of the channel layers 110. A lower horizontal surface of the middle dielectric isolation layer 132 may be an upper horizontal surface of an uppermost sacrificial layer 110 of the lower nanosheet stack 101. An upper horizontal surface of the middle dielectric isolation layer 132 may be a lower horizontal surface of a lowermost sacrificial layer 110 of the upper nanosheet stack 103.

The insulator 144 may be conformally deposited on the structure 100. The insulator 144 may be formed by depositing or growing a dielectric material on the structure 100. The insulator 144 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an etch process such as wet etch or a reactive ion etch (RIE), or any suitable etch process. In an embodiment, the insulator 144 may include any dielectric material such as silicon oxide, silicon oxynitride, silicon nitride, SiBCN, SiOC, low-k dielectric or any combination of these materials. Portions of the insulator 144 may be removed from an upper horizontal surface of the substrate 102 and an upper horizontal surface of the N well 104 by an anisotropic etching technique, such as, for example, reactive ion etching (RIE), and stopping on etching a portion of the substrate 102 and etching a portion of the N well 104. The insulator 144 may be formed along vertical side surfaces of the trench 141 and the trench 143, along vertical side surfaces of the gate side spacer 128, the channel layers 112, the side spacers 140 and the middle dielectric isolation layer 132. The insulator 144 may be formed on a horizontal upper surface of the gate side spacer 128 and the sacrificial gate 126.

Figure 4:
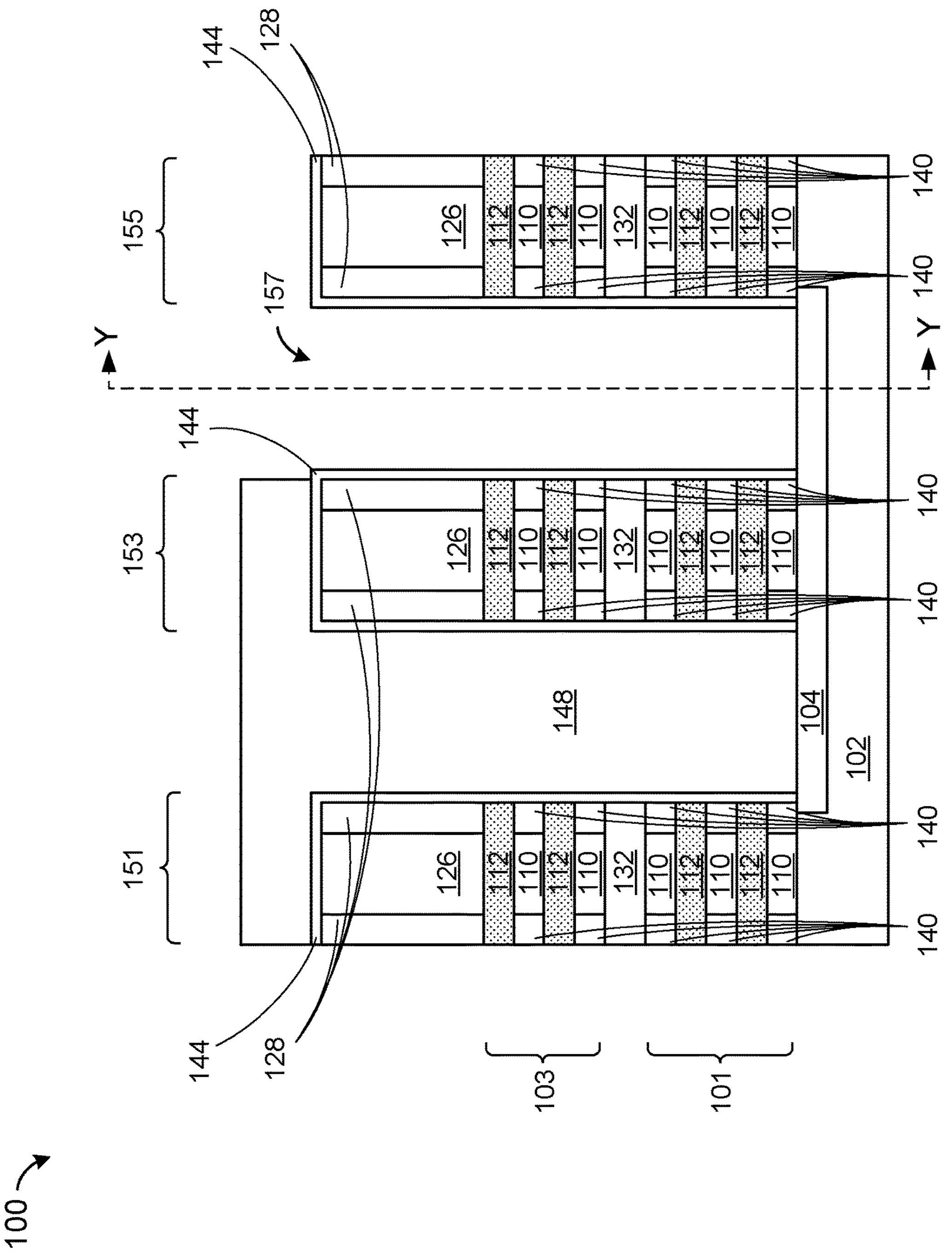
FIGS. 4 and 5 each illustrate cross-sectional view of the semiconductor structure, along section lines X-X and Y-Y, respectively, and illustrates forming an organic planarization layer, according to an exemplary embodiment.
Figure 5:
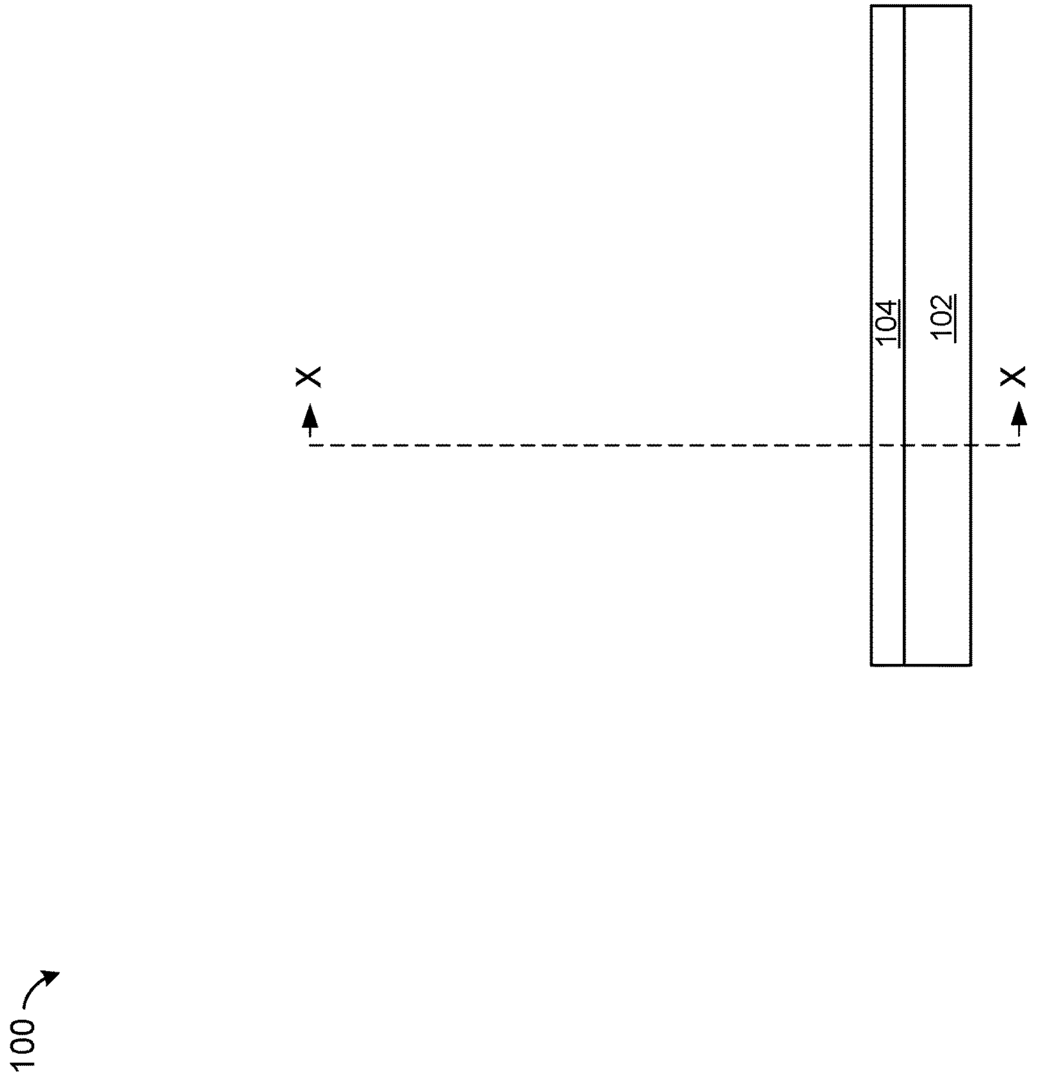

Referring now to FIGS. 4 and 5, the structure 100 is shown according to an exemplary embodiment. FIG. 4 is a cross-sectional view of the structure 100 along section line X-X. FIG. 5 is a cross-sectional view of the structure 100 along section line Y-Y. FIGS. 4 and 5 are perpendicular to each other. A lithography soft mask, such as an organic planarization layer 148 (hereinafter "OPL") may be used for the patterning process.

The OPL 148 may be formed by a blanket deposition using typical deposition techniques, for example spin-on coating. The OPL 148 can be a self-planarizing organic material that includes carbon, hydrogen, oxygen, and optionally nitrogen, fluorine, and silicon. The OPL 148 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A lithograph patterning and dry etch technique may be used to selectively remove a portion of the OPL 148. The OPL 148 may be removed between the nanosheet stacks 153,155, forming the trench 157. The OPL 148 may be removed from an upper horizontal surface of the nanosheet stack 155. A lower surface of the trench 157 may be an upper surface of the N well 104.

The trench 157 may be re-formed by an anisotropic etching technique, such as, for example, reactive ion etching (RIE), removing aligned portions of the OPL 170 and stopping on etching a portion of the N well 104. The etch process is self-aligned process. It may selectively etch the OPL 148, with respect to the insulator 144 and the N-well 104.

Figure 6:
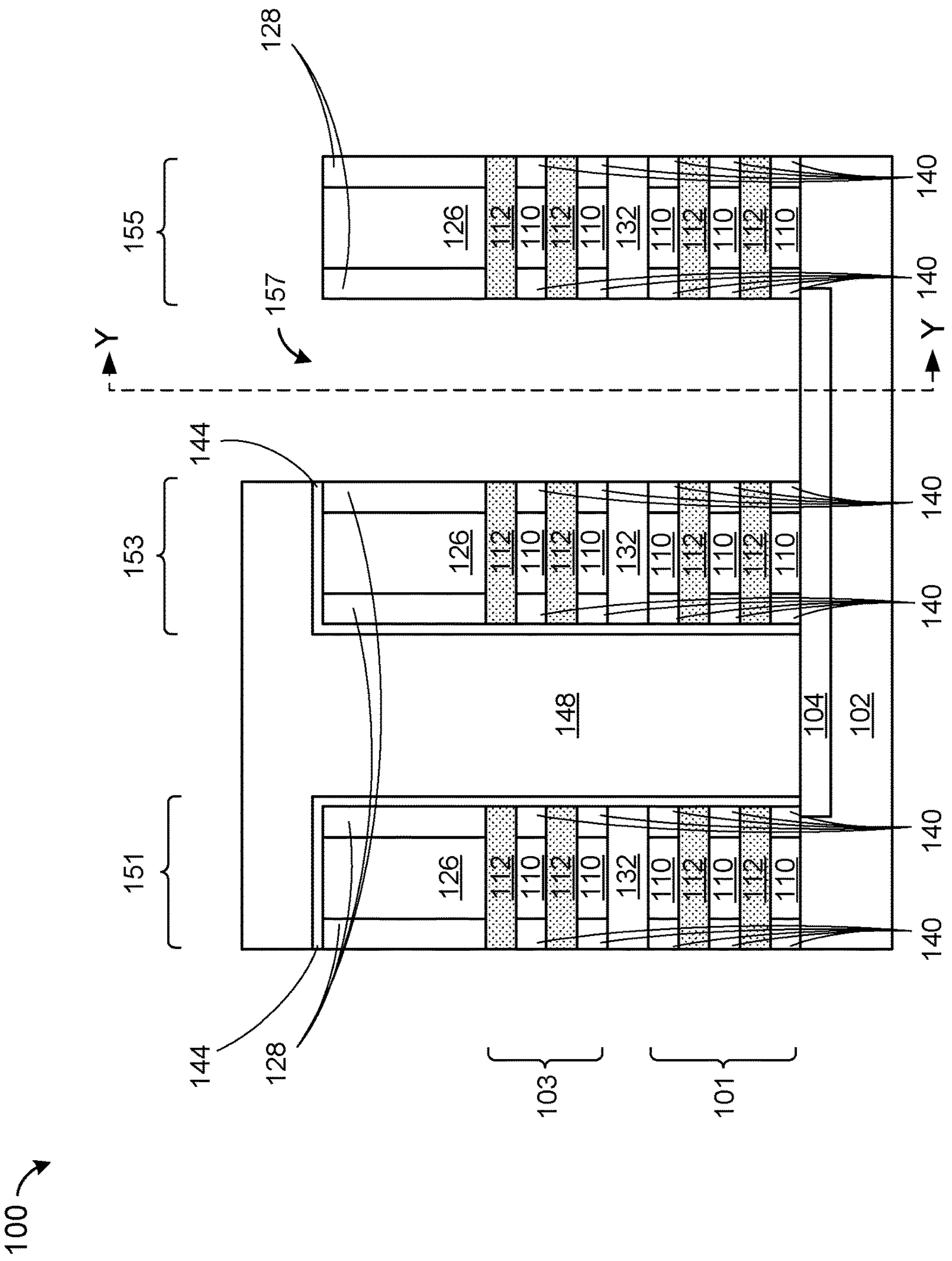
FIGS. 6 and 7 each illustrate a cross-sectional view of the semiconductor structure, along section lines X-X and Y-Y, respectively, and illustrates removing a portion of a liner, according to an exemplary embodiment.
Figure 7:
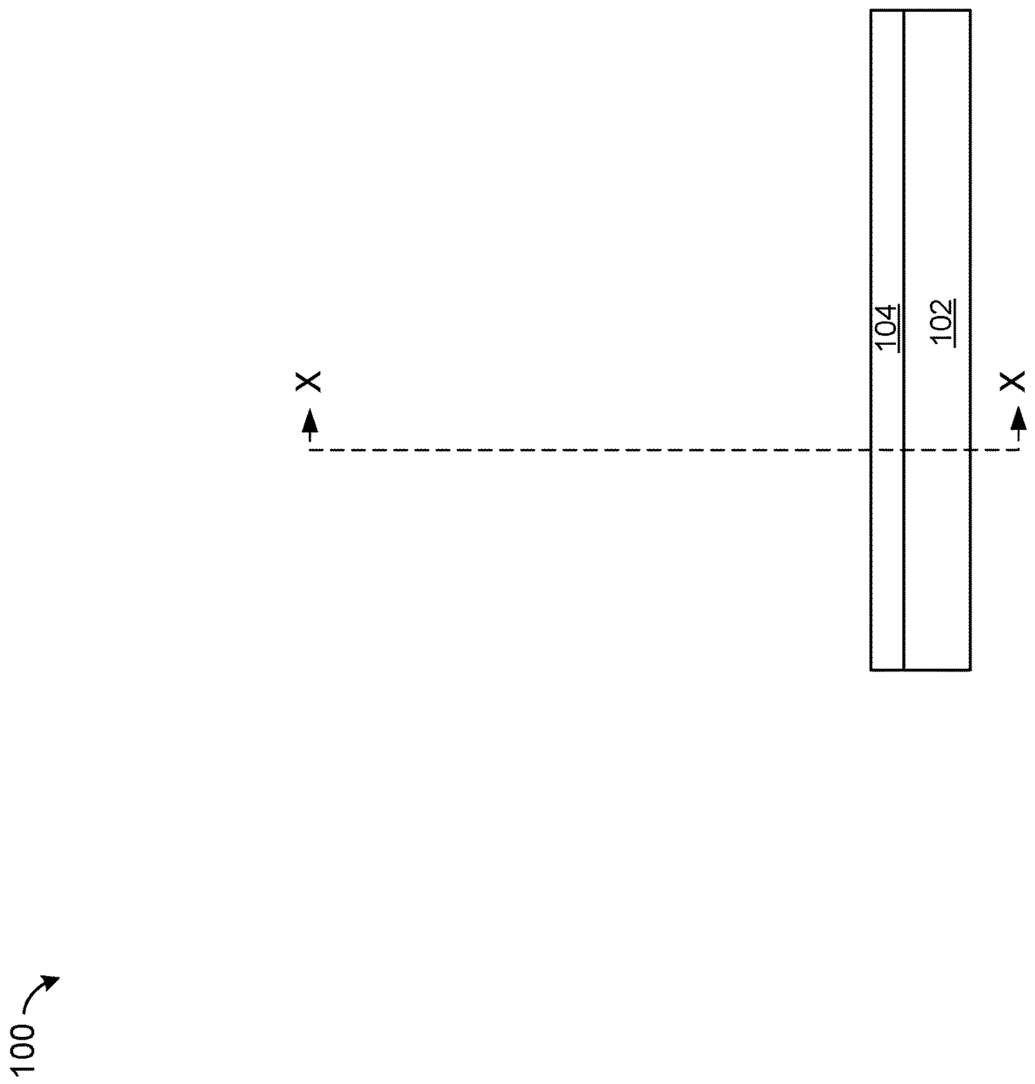

Referring now to FIGS. 6 and 7, the structure 100 is shown according to an exemplary embodiment. FIG. 6 is a cross-sectional view of the structure 100 along section line X-X. FIG. 7 is a cross-sectional view of the structure 100 along section line Y-Y. FIGS. 6 and 7 are perpendicular to each other. Portions of the insulator 144 may be removed.

The portions of the insulator 144 may be removed from a first vertical side surface of the nanosheet stack 153, from a first vertical side surface of the nanosheet stack 155 and from an upper horizontal surface of the nanosheet stack 155. The portions of the insulator 144 may be removed from areas which are not protected by the OPL 148. The portions of the insulator 144 may be removed by methods known in the arts, selective to the channel layers 112, the side spacers 140, the gate side spacer 128, and the N-well 104.

Figure 8:
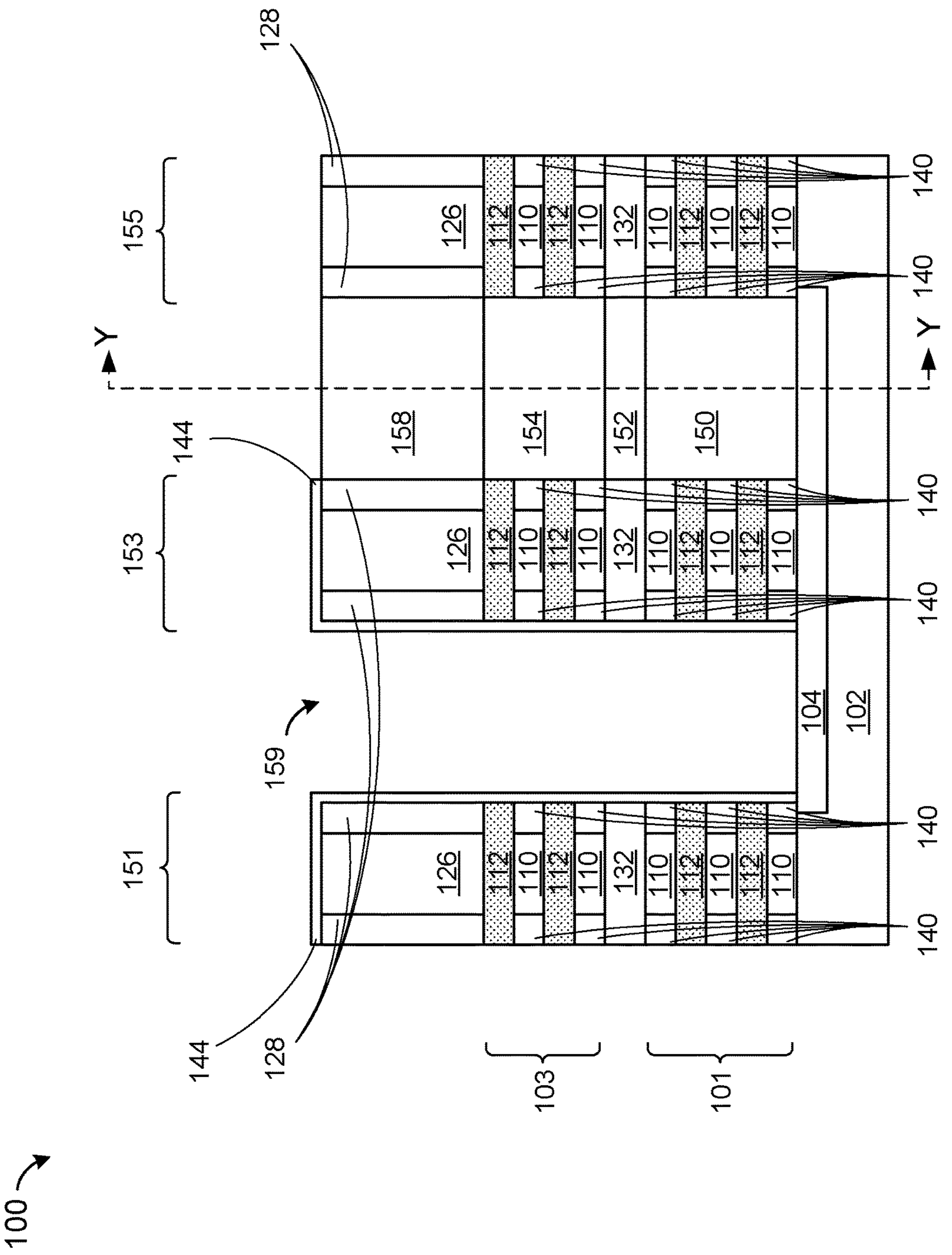
FIGS. 8 and 9 each illustrate a cross-sectional view of the semiconductor structure, along section lines X-X and Y-Y, respectively, and illustrates forming a lower source drain and an upper source drain, according to an exemplary embodiment.
Figure 9:
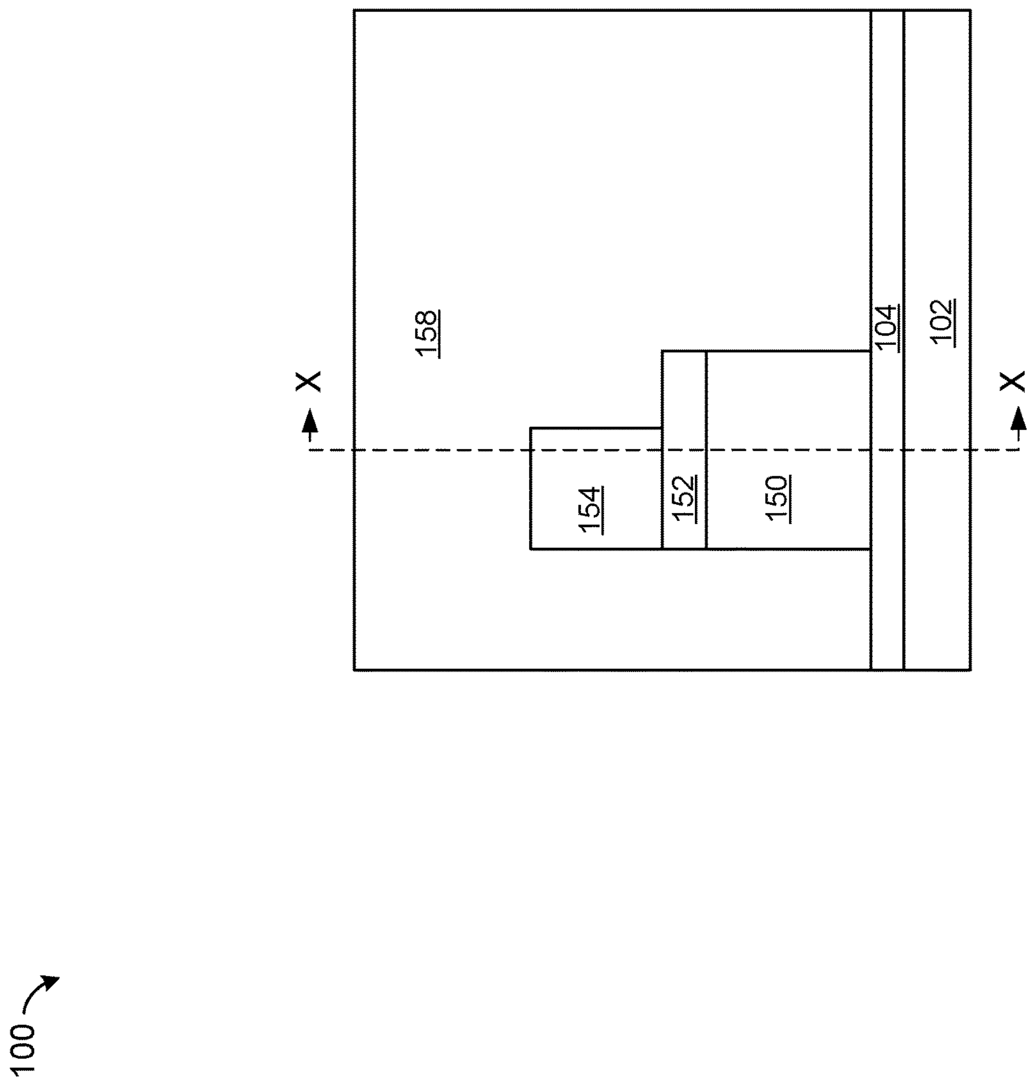

Referring now to FIGS. 8 and 9, the structure 100 is shown according to an exemplary embodiment. FIG. 8 is a cross-sectional view of the structure 100 along section line X-X. FIG. 9 is a cross-sectional view of the structure 100 along section line Y-Y. FIGS. 8 and 9 are perpendicular to each other. A lower source drain 150, an interlayer dielectric (hereinafter "ILD") 152 and an upper source drain 154 may be formed. An interlayer dielectric (hereinafter "ILD") 158 may be formed. Remaining portions of the OPL 148 may be removed.

The lower source drain 150 and the upper source drain 154 may each be grown separately by methods known in the arts. For example, the lower source drain 150 may be first formed, a dielectric such as the ILD 152, may be formed above the lower source drain 150, and the upper source drain 154 may be formed on the ILD 152. The ILD 158 may be formed on the upper source drain 154.

The lower source drain 150 and the upper source drain 154 may each be epitaxially grown surrounding a vertical portion of the nanosheet stack on opposite sides of the sacrificial gate (not shown) in the trench 157, on the N-well 104 between the nanosheet stacks 153, 155. The lower source drain 150 may surround the channel layers 112 in the lower nanosheet stack 101 of the nanosheet stacks 153, 155. The upper source drain 154 may surround the channel layers 112 in the upper nanosheet stack 103 of the nanosheet stacks 153, 155.

The ILD 152 may be formed by depositing or growing a dielectric material, followed by a combination of CMP and dry/wet etch and recessing steps on structure 100. The ILD 152 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an etch process such as wet etch or a reactive ion etch (RIE), or any suitable etch process. In an embodiment, the ILD 152 may include one or more layers. In an embodiment, the ILD 152 may include any dielectric material such as silicon oxide, silicon oxynitride, silicon nitride, SiBCN, SiOC, low-k dielectric or any combination of these materials. In an embodiment, the ILD 152 may be a nitride. In an alternate embodiment, the ILD 152 may be an oxide.

The ILD 158 may be formed as described for the ILD 152 and fill a remaining portion of the trench 157 between the nanosheet stacks 153, 155.

A lithograph patterning and dry etch technique may be used to selectively remove removing portions of the OPL 148, forming a trench 159 between the nanosheet stacks 151, 153. An upper horizontal surface of the N well 104 may be exposed in the trench 159. Vertical side surfaces of the insulator 144 may be exposed along vertical side surfaces and of the nanosheet stacks 151, 153. An upper horizontal surface of the insulator 144 may be exposed over upper horizontal surfaces of the sacrificial gate 126 and the gate side spacers 128 on the nanosheet stacks 151, 153.

Figure 10:
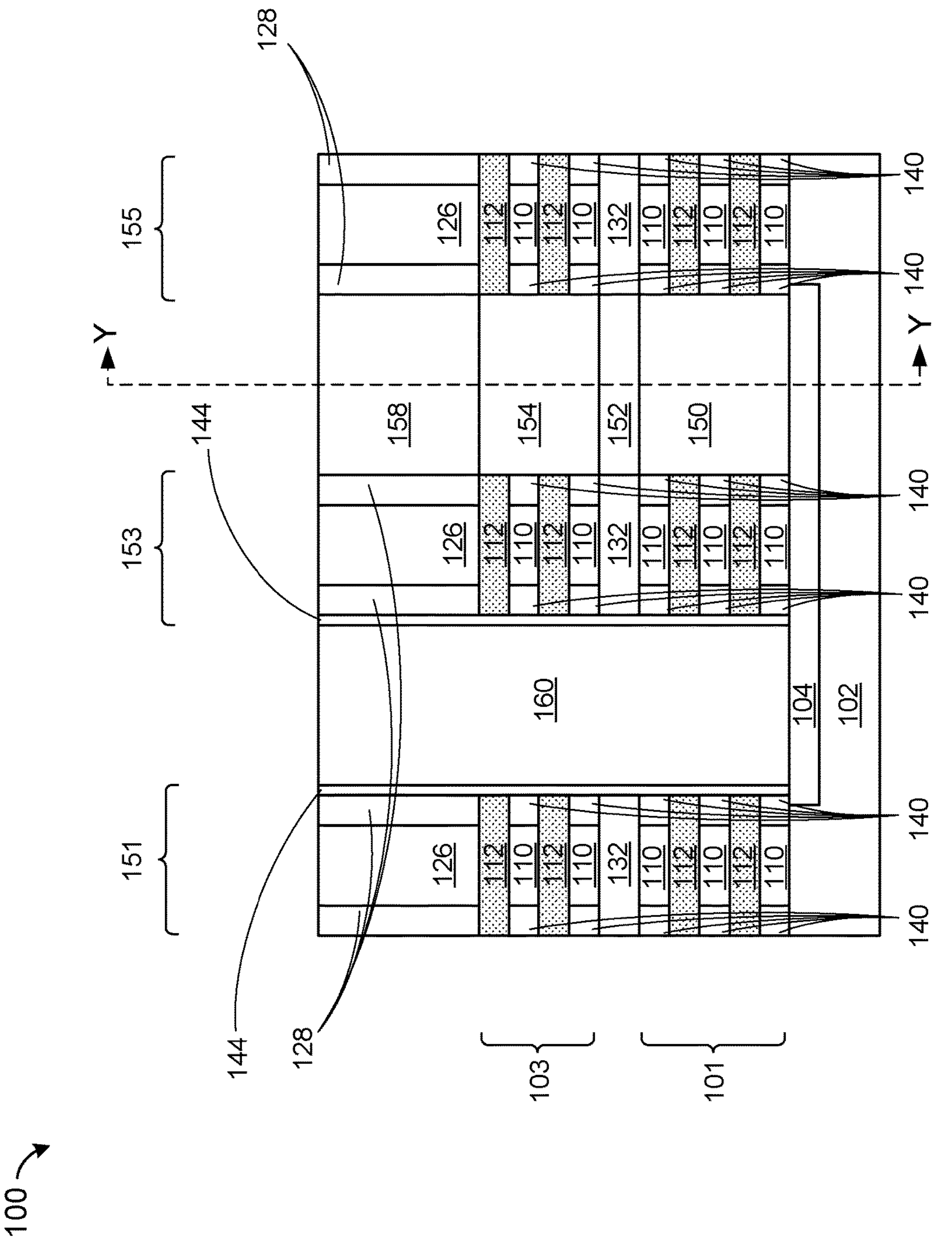
FIGS. 10 and 11 each illustrate a cross-sectional view of the semiconductor structure, along section lines X-X and Y-Y, respectively, and illustrates forming an inter-layer dielectric, according to an exemplary embodiment.
Figure 11:
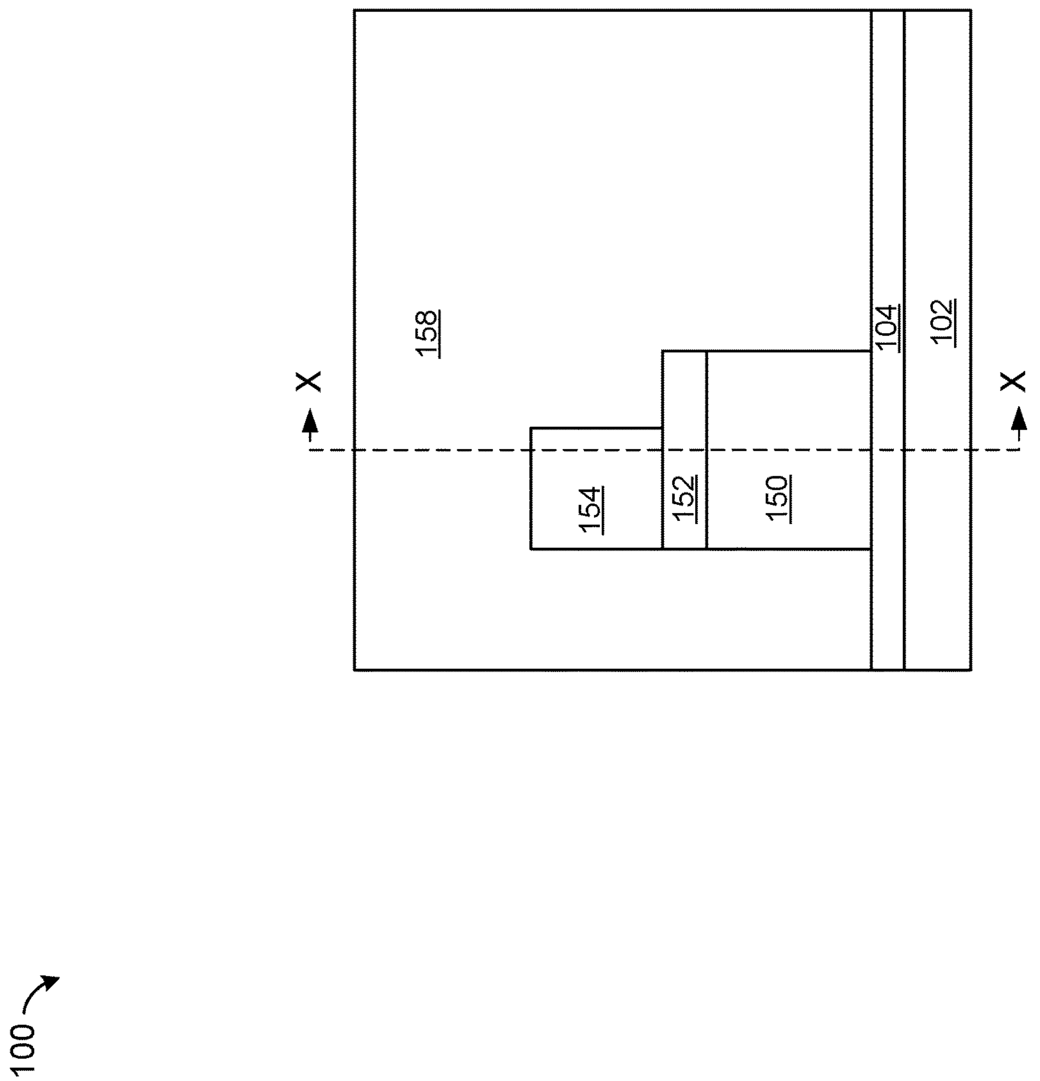

Referring now to FIGS. 10 and 11, the structure 100 is shown according to an exemplary embodiment. FIG. 10 is a cross-sectional view of the structure 100 along section line X-X. FIG. 11 is a cross-sectional view of the structure 100 along section line Y-Y. FIGS. 10 and 11 are perpendicular to each other. An interlayer dielectric (hereinafter "ILD") 160 may be formed.

The ILD 160 may be formed as described for the ILD 152, filling the trench 159.

A chemical mechanical polishing (CMP) technique may be used to remove excess material and polish upper surfaces of the structure 100. A portion of the insulator 144 may be removed from an upper horizontal surface of the sacrificial gate 126 and the gate side spacers 128. An upper surface of the structure 100 may include horizontal surfaces of the ILD 160, the insulator 144, the sacrificial gate 126, the gate side spacers 128 and the ILD 158.

Figure 12:
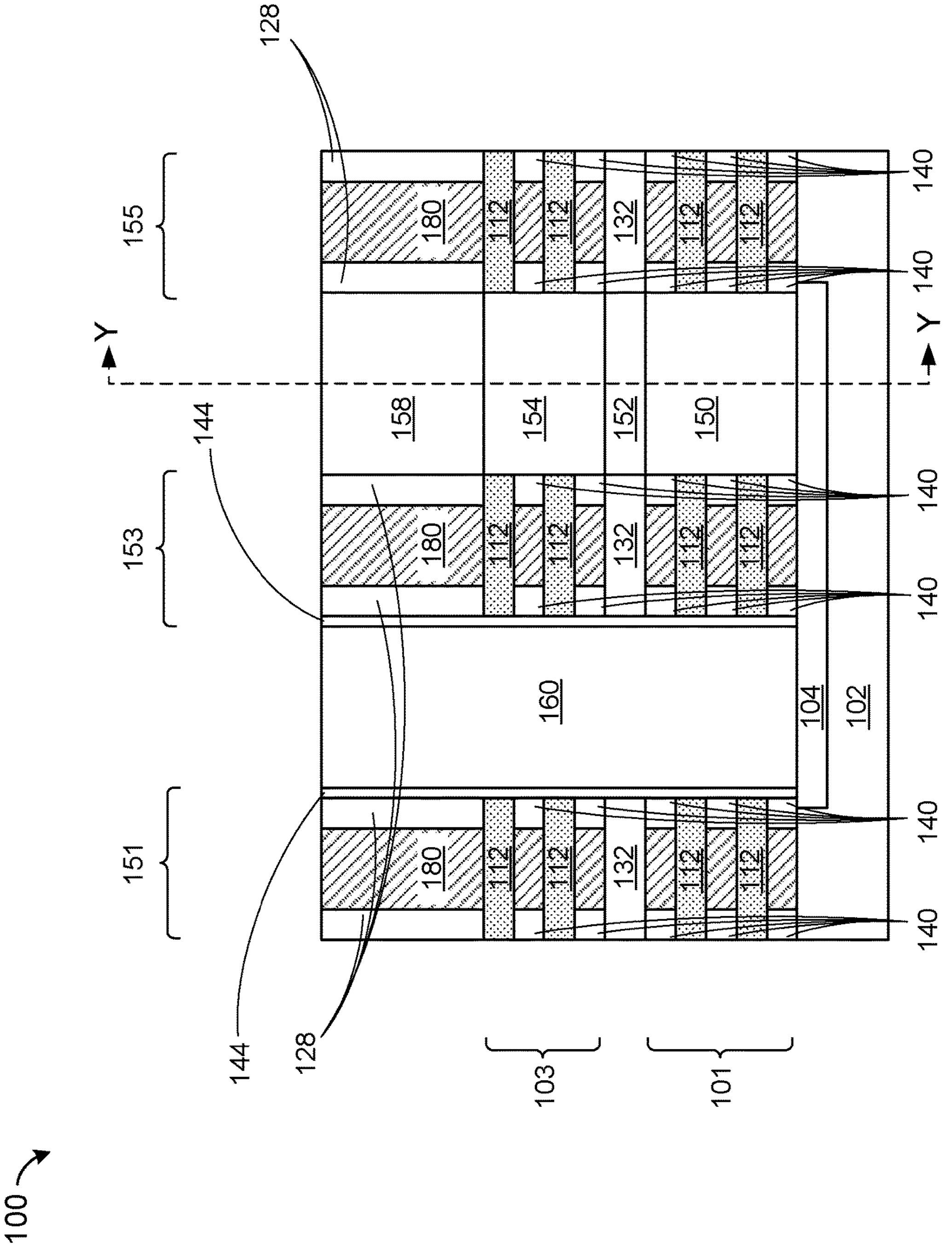
FIGS. 12 and 13 each illustrate a cross-sectional view of the semiconductor structure, along section lines X-X and Y-Y, respectively, and illustrates forming a replacement gate, according to an exemplary embodiment.
Figure 13:
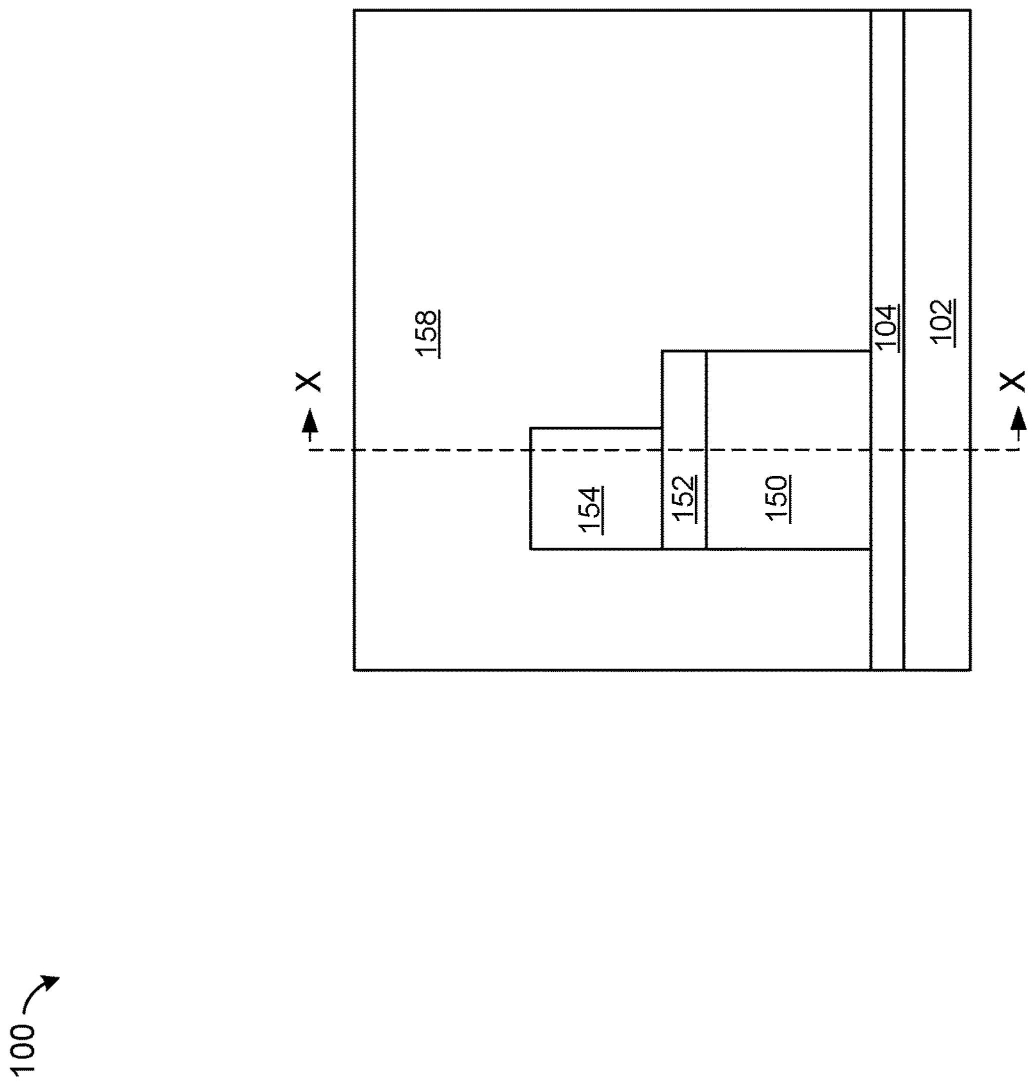

Referring now to FIGS. 12 and 13, the structure 100 is shown according to an exemplary embodiment. FIG. 12 is a cross-sectional view of the structure 100 along section line X-X. FIG. 13 is a cross-sectional view of the structure 100 along section line Y-Y. FIGS. 12 and 13 are perpendicular to each other. A replacement gate 180 may be formed.

The sacrificial gate 126 may be removed by methods known in the arts. The sacrificial layers 110 may be removed by methods known in the arts. The sacrificial gate 126 and the sacrificial layers 110 may be removed simultaneously or consecutively. The sacrificial gate 126 and the sacrificial layers 110 are removed selective to the channel layers 112, the ILD 160, the ILD 158, the ILD 152, the upper source drain 154, the lower source drain 150, the N well 104, the middle dielectric isolation layer 132, the gate side spacers 128, the side spacers 140, the insulator 144 and the substrate 102. For example, a dry etch process can be used to selectively remove the sacrificial gate 126 and the sacrificial layers 110, such as using vapor phased HCl dry etch. An upper surface and a lower surface of the channel layers 112 may be exposed.

The replacement gate 180 may be conformally formed on the structure 100, according to an exemplary embodiment.

The replacement gate 180 is formed in each cavity of the nanosheet stack and surrounding suspended portions of the channel layers 112. The replacement gate 180 forms a layer surrounding exposed portions of the nanosheet stacks. The replacement gate 180 may cover vertical side surfaces, an upper horizontal surface and a lower horizontal surface of the channel layers 112.

The replacement gate 180 may be deposited using typical deposition techniques, for example, atomic layer deposition (ALD), molecular layer deposition (MLD), and chemical vapor deposition (CVD). In an embodiment, the replacement gate 180 may include more than one layer, for example, a conformal layer of a high-k dielectric material such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. In an embodiment, a work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

In an embodiment, the replacement gate 180 of the upper nanosheet stack 103 may include a different material than the replacement gate 180 of the lower nanosheet stack 101.

A chemical mechanical polishing (CMP) technique may be used to remove excess material and polish upper surfaces of the structure 100. An upper surface of the structure 100 may include horizontal surfaces of the ILD 160, the ILD 158, the gate side spacers 128, the insulator 144 and the replacement gate 180.

Figure 14:
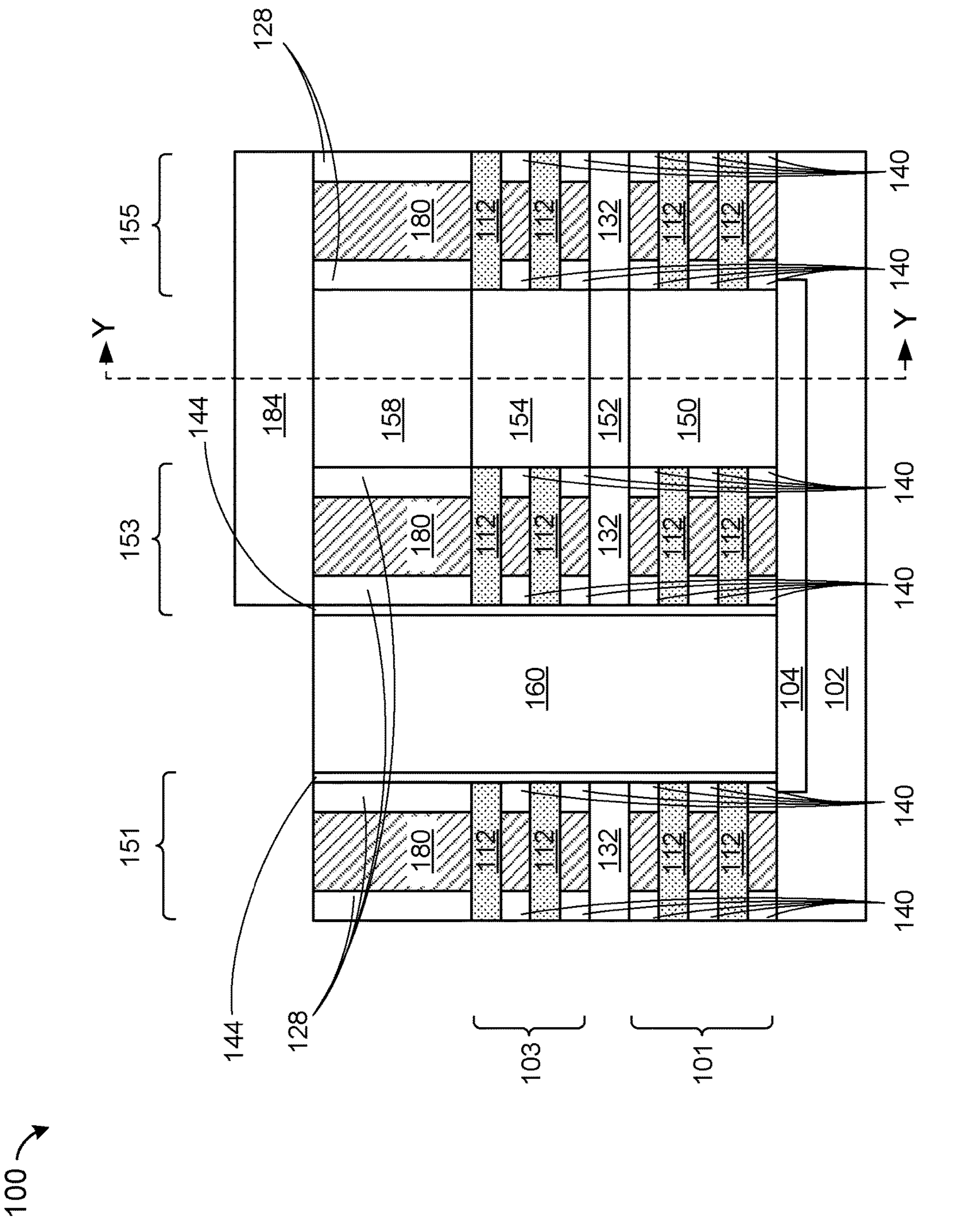
FIGS. 14 and 15 each illustrate a cross-sectional view of the semiconductor structure, along section lines X-X and Y-Y, respectively, and illustrates forming a second organic planarization layer, according to an exemplary embodiment.
Figure 15:
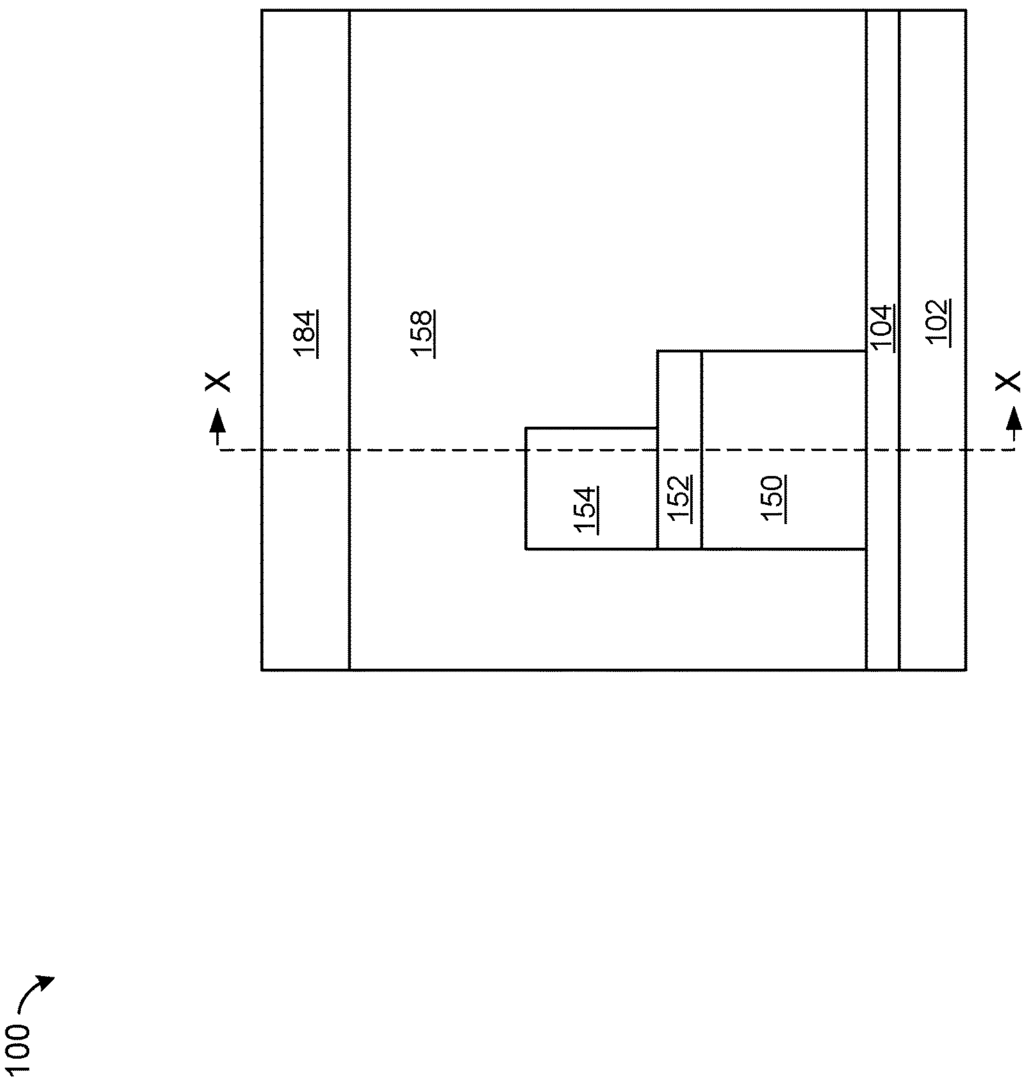

Referring now to FIGS. 14 and 15, the structure 100 is shown according to an exemplary embodiment. FIG. 14 is a cross-sectional view of the structure 100 along section line X-X. FIG. 15 is a cross-sectional view of the structure 100 along section line Y-Y. FIGS. 14 and 15 are perpendicular to each other. A lithography soft mask, such as an organic planarization layer 184 (hereinafter "OPL") may be used for the patterning process.

The OPL 184 may be formed as described for the OPL 148. A lithograph patterning and dry etch technique may be used to selectively remove a portion of the OPL 184. The OPL 184 may be removed between the nanosheet stacks 153. The OPL 148 may be removed from an upper horizontal surface of the nanosheet stack 151.

Figure 16:
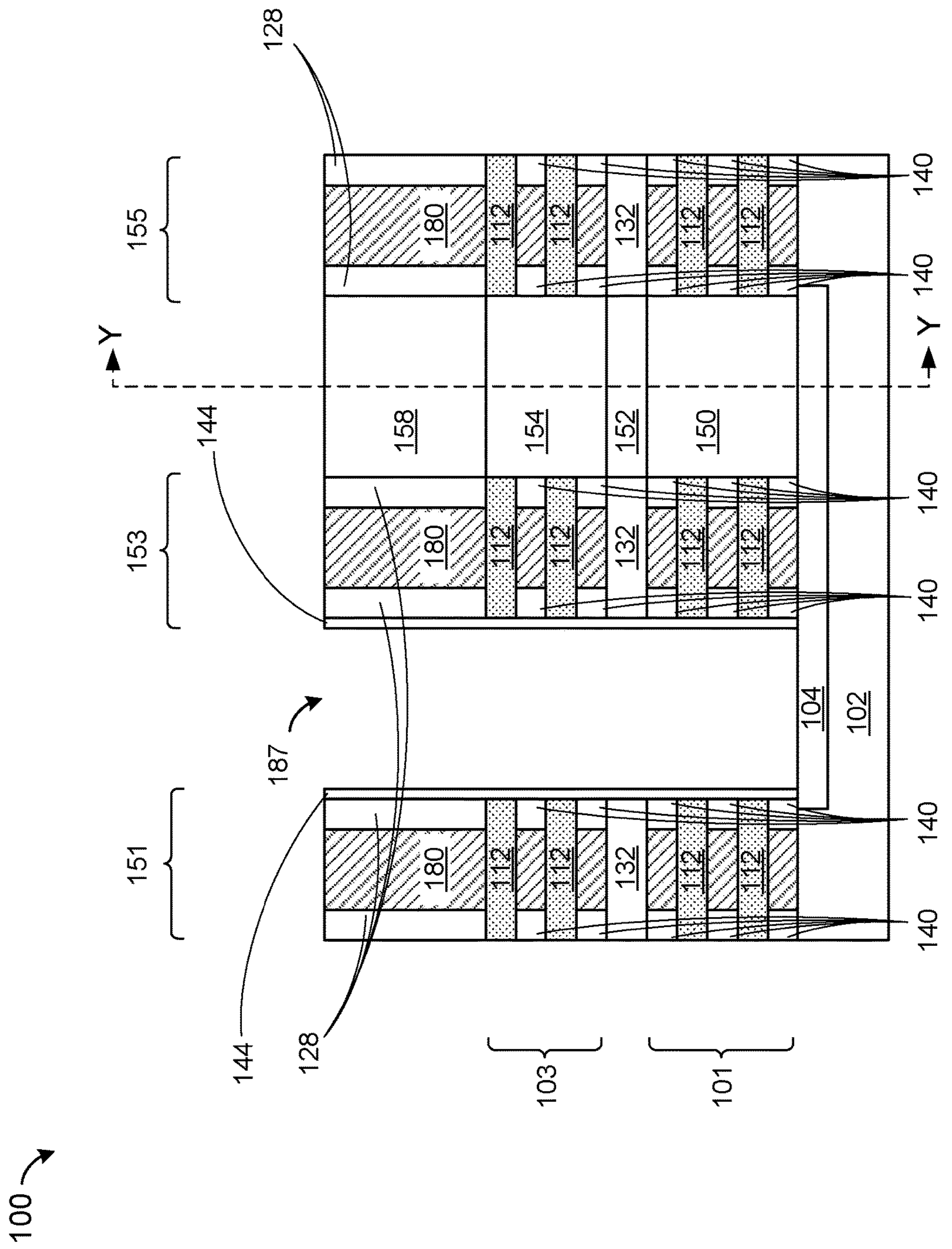
FIGS. 16 and 17 each illustrate a cross-sectional view of the semiconductor structure, along section lines X-X and Y-Y, respectively, and illustrates removing the inter-layer dielectric and removing the second organic planarization layer, according to an exemplary embodiment.
Figure 17:
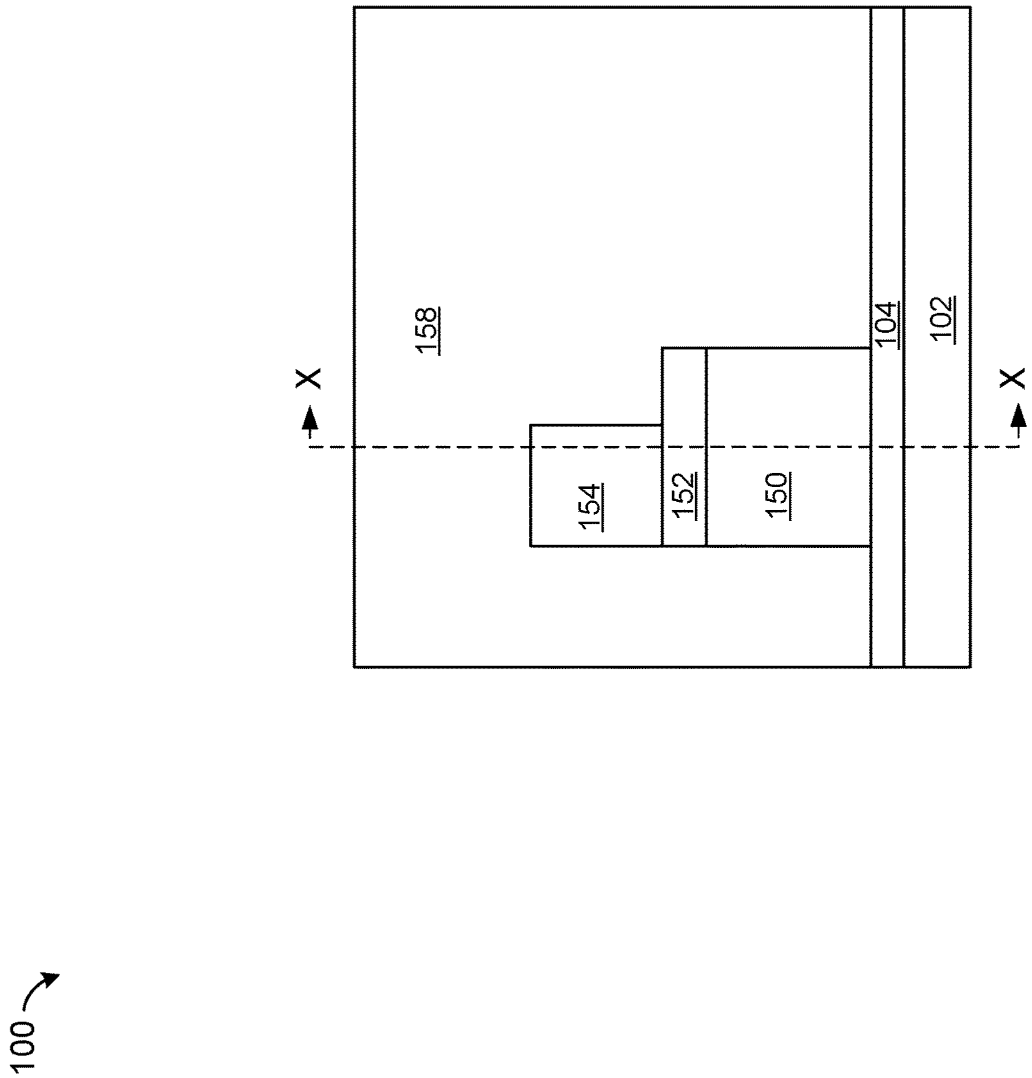

Referring now to FIGS. 16 and 17, the structure 100 is shown according to an exemplary embodiment. FIG. 16 is a cross-sectional view of the structure 100 along section line X-X. FIG. 17 is a cross-sectional view of the structure 100 along section line Y-Y. FIGS. 16 and 17 are perpendicular to each other. The ILD 160 may be removed. The OPL 184 may be removed.

The ILD 160 may be removed, forming a trench 187 between the nanosheet stacks 151, 153. The trench 187 may be formed by an anisotropic etching technique, such as, for example, reactive ion etching (RIE), removing the ILD 160 and stopping on etching a portion of the N well 104. The etch process is self-aligned process. It may selectively etch the ILD 160, with respect to the insulator 144 and the N-well 104.

Figure 18:
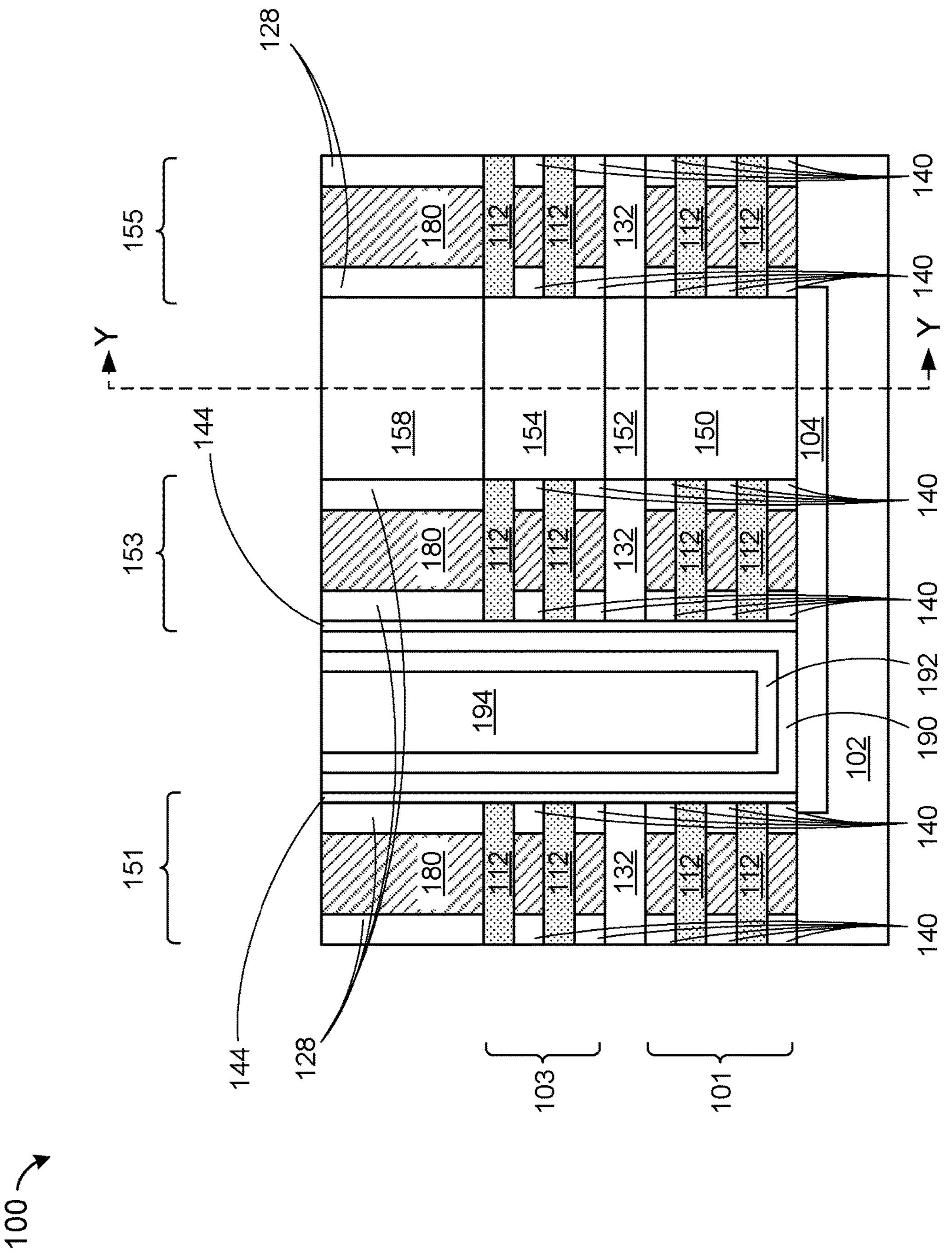
FIGS. 18 and 19 each illustrate a cross-sectional view of the semiconductor structure, along section lines X-X and Y-Y, respectively, and illustrates formation of an outer plate metal, an insulator and an inner metal plate, according to an exemplary embodiment.
Figure 19:
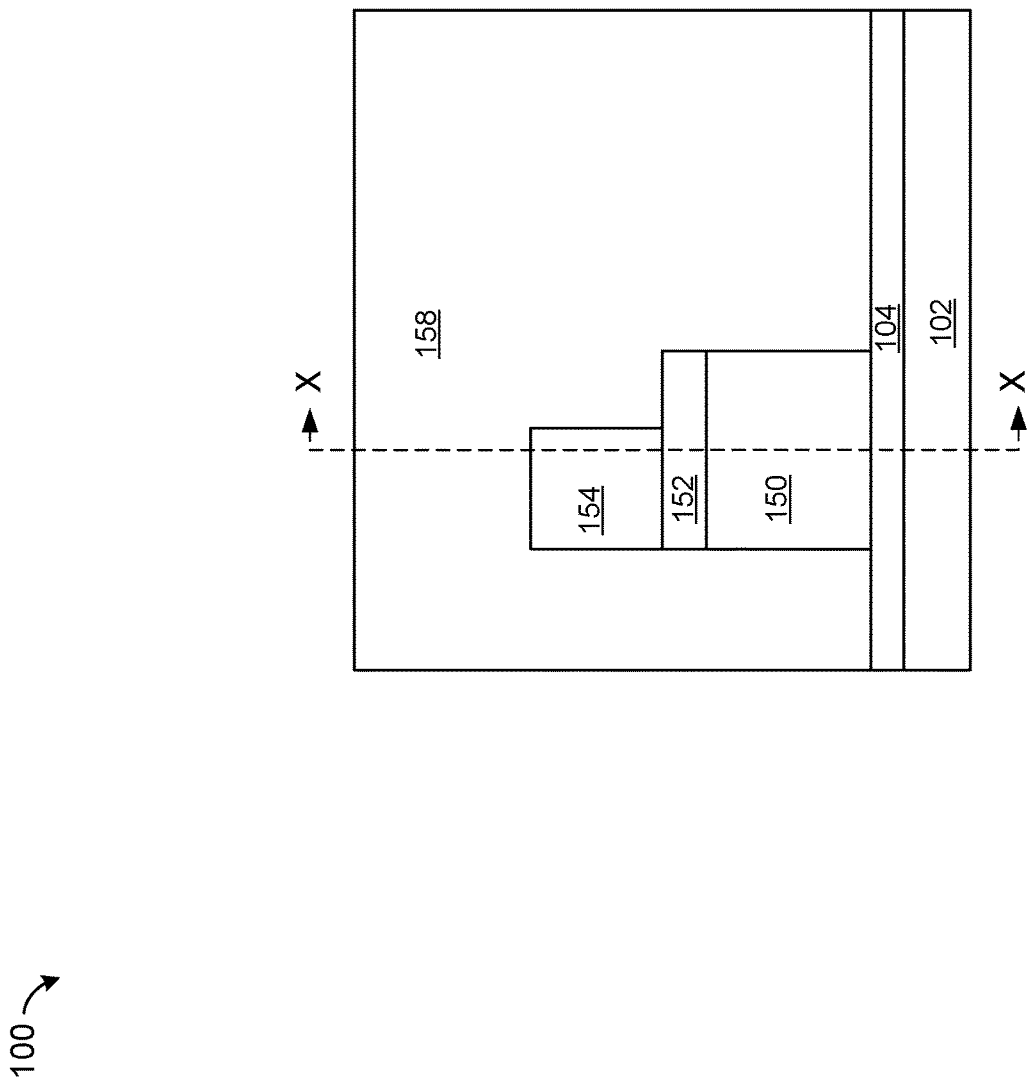

Referring now to FIGS. 18 and 19, the structure 100 is shown according to an exemplary embodiment. FIG. 18 is a cross-sectional view of the structure 100 along section line X-X. FIG. 19 is a cross-sectional view of the structure 100 along section line Y-Y. FIGS. 18 and 19 are perpendicular to each other. A Metal Insulator Metal (MIM) capacitor may be formed in the trench 187.

The MIM capacitor includes an outer plate 190, an insulator 192 and an inner plate 194. The outer plate 190 may be formed in a portion of the trench 187, along a vertical side surface of the insulator 144 and on the upper horizontal surface of the N well 104.

In an embodiment, the outer plate 190 is formed from a conductive material layer which is blanket deposited on top of the structure 100, and directly on vertical side surfaces of the insulator 144 and an upper horizontal surface of the N well 104, filling a portion of the trench 187. The conductive material layer may include materials such as, for example copper (Cu), ruthenium (Ru), tungsten (W), tantalum nitride (TaN) and titanium nitride (TiN). The conductive material can be formed by for example, electrochemical deposition (ECD), chemical vapor deposition (CVD), physical vapor deposition (PVD), and atomic layer deposition (ALD) or a combination thereof. The outer plate 190 is formed by damascene, or patterned from the conductive material layer, using known patterning and etching techniques.

The insulator 192 may be conformally deposited on the structure 100, directly on a vertical side surface and a horizontal upper surface of the outer plate 190, in a portion of the trench 187. The insulator 192 may be formed by depositing or growing a dielectric material on the structure 100. The insulator 192 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the insulator 192 may include any high-k dielectrics including, but are not limited to, $HfO_2$, $ZrO_2$, $La_2O_3$, $Al_2O_3$, $TiO_2$, a high-k dielectric material (with $k>4.0$).

The inner plate 194 may be formed as described for the outer plate 190, blanket deposited on top of the structure 100, and directly on vertical side surfaces and a horizontal upper surface of the insulator 192, filling a remaining portion of the trench 187.

A planarization process, such as, for example, chemical mechanical polishing (CMP), may be done to remove excess material from an upper horizontal surface of the structure 100 such that upper horizontal surfaces of the inner plate 194, the insulator 192, the outer plate 190, the insulator 144, the gate side spacers 128, the replacement gate 180 and the ILD 158 are coplanar.

The insulator 144 physically and electrically separates the MIM capacitor from the stacked nanosheets 151, 153, and from the N-well 104.

Figure 20:
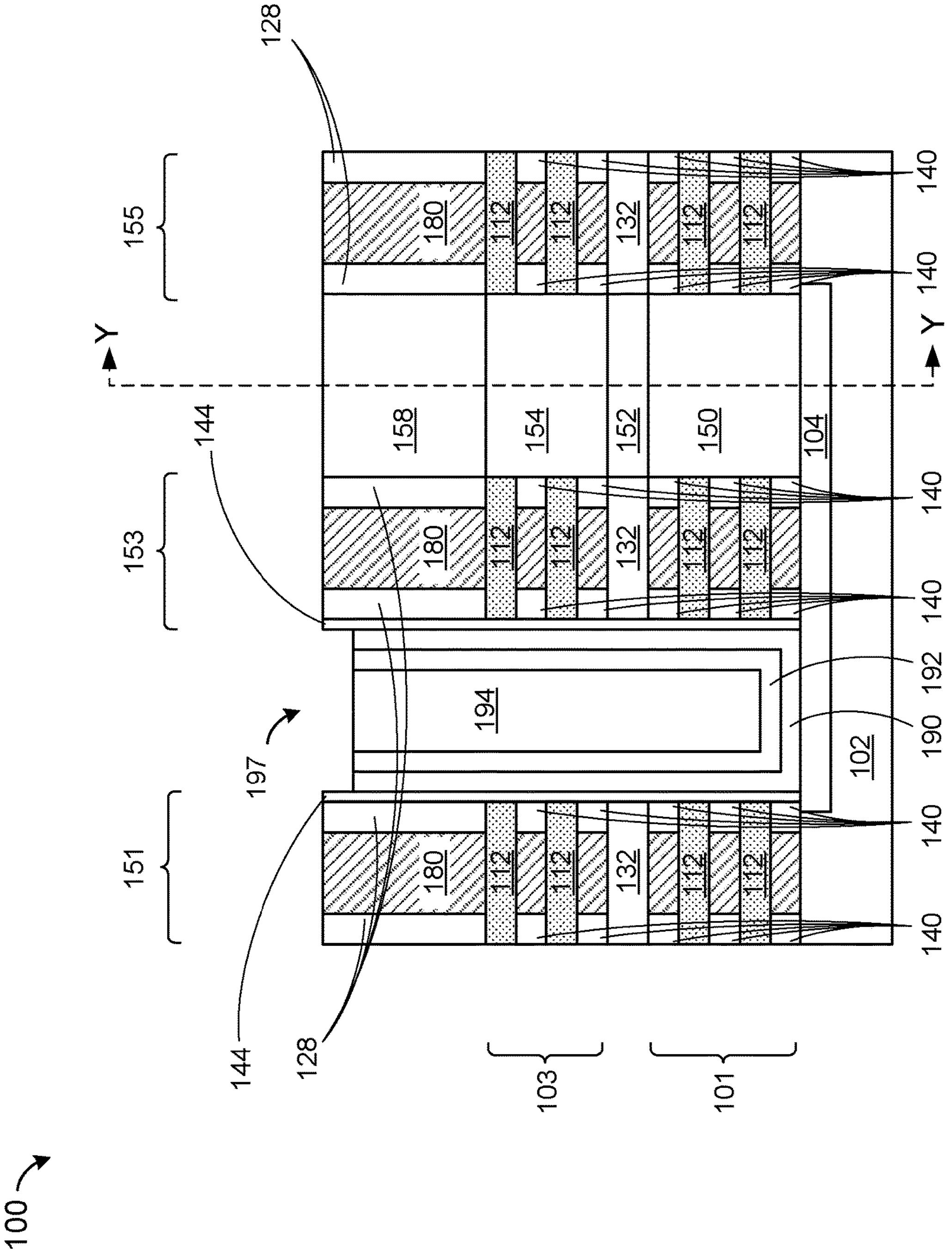
FIGS. 20 and 21 each illustrate a cross-sectional view of the semiconductor structure, along section lines X-X and Y-Y, respectively, and illustrates removal of portions of each of the outer plate metal, the insulator and the inner metal plate, according to an exemplary embodiment.
Figure 21:
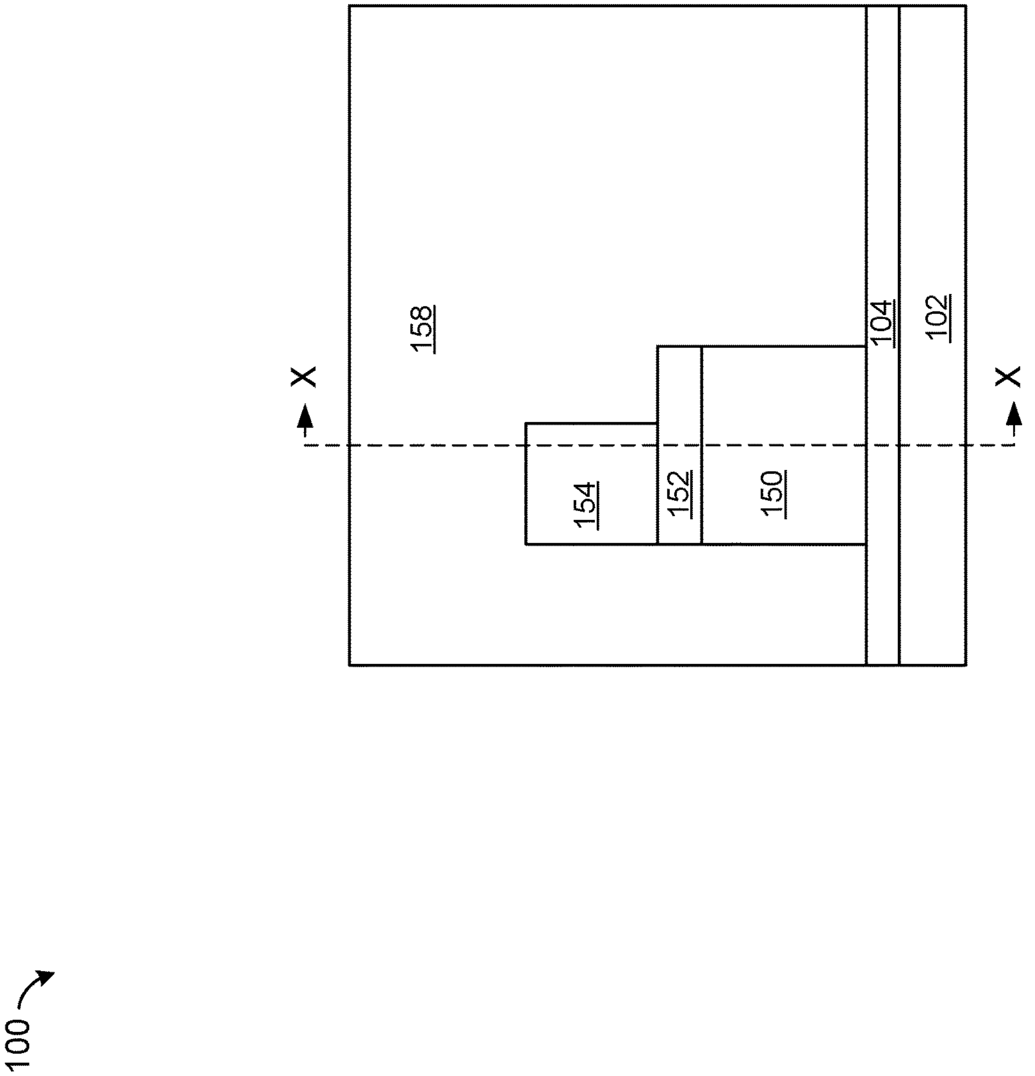

Referring now to FIGS. 20 and 21, the structure 100 is shown according to an exemplary embodiment. FIG. 20 is a cross-sectional view of the structure 100 along section line X-X. FIG. 21 is a cross-sectional view of the structure 100 along section line Y-Y. FIGS. 20 and 21 are perpendicular to each other. A portion of the inner plate 194, a portion of the insulator 192 and a portion of the outer plate 190 may be removed, forming a trench 197.

The trench 197 may be formed by an anisotropic etching technique, such as, for example, reactive ion etching (RIE), removing a portion of the inner plate 194, a portion of the insulator 192 and a portion of the outer plate 190. A horizontal upper surface of the inner plate 194, a horizontal upper surface of the insulator 192 and a horizontal upper surface of the outer plate 190 may form a lower horizontal surface of the trench 197. A vertical side surface of the insulator 144 may exposed along the trench 197.

Figure 22:
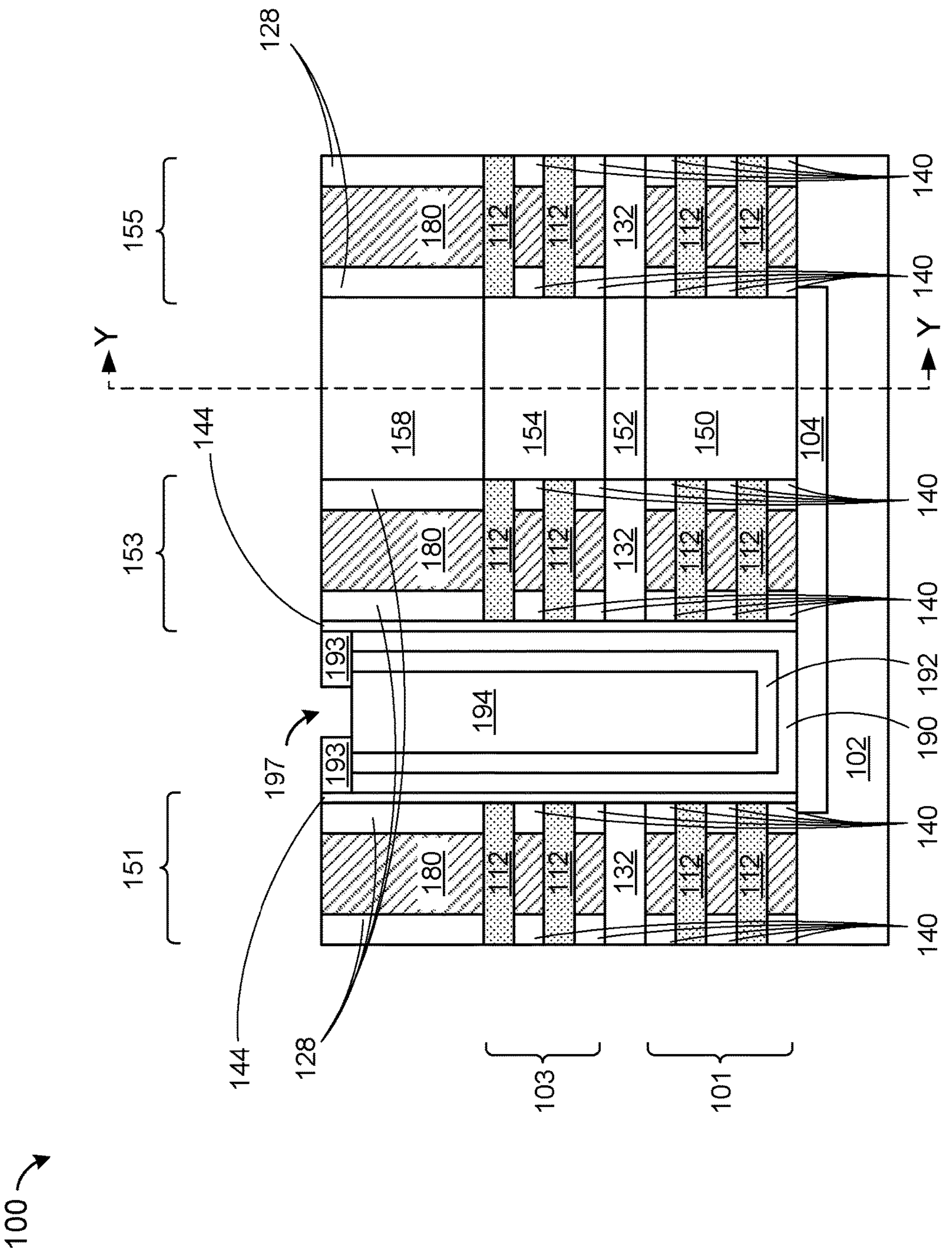
FIGS. 22 and 23 each illustrate a cross-sectional view of the semiconductor structure, along section lines X-X and Y-Y, respectively, and illustrates formation of a dielectric, according to an exemplary embodiment.
Figure 23:
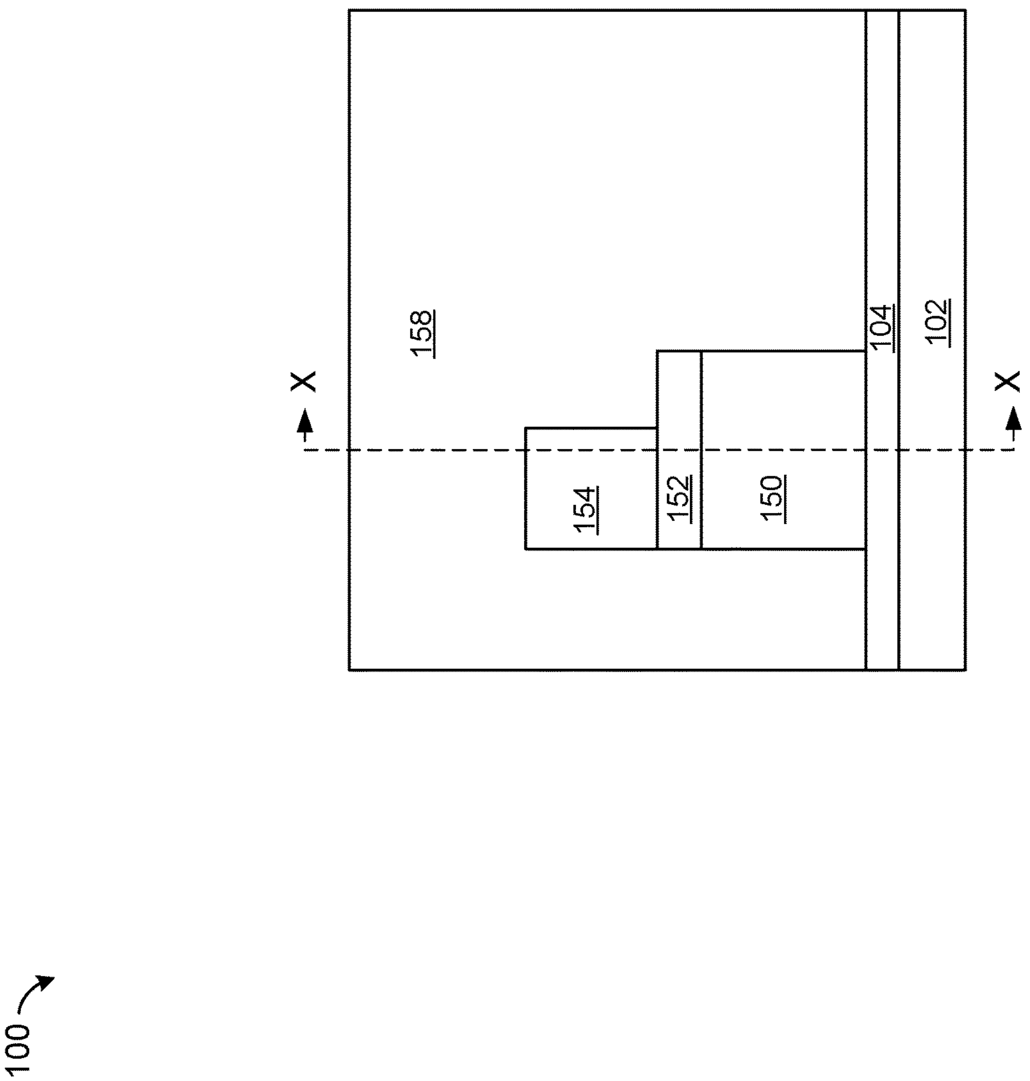

Referring now to FIGS. 22 and 23, the structure 100 is shown according to an exemplary embodiment. FIG. 22 is a cross-sectional view of the structure 100 along section line X-X. FIG. 23 is a cross-sectional view of the structure 100 along section line Y-Y. FIGS. 22 and 23 are perpendicular to each other. A dielectric spacer 193 may be formed.

The dielectric spacer 193 may be formed in a portion of the trench 197. The dielectric spacer 193 may be formed by depositing or growing a dielectric material, followed by a combination of CMP and dry/wet etch and recessing steps on structure 100. The dielectric spacer 193 may be formed as described for the ILD 152. The dielectric spacer 193 may be formed in the trench 197, on upper horizontal surfaces of the inner plate 194, the insulator 192 and the outer plate 190. A portion of the dielectric spacer 193 may be removed, by an anisotropic etching technique, such as, for example, reactive ion etching (RIE), exposing an upper horizontal surface of the inner plate 194. The dielectric spacer 193 may remain on the insulator 192 and the outer plate 190.

Figure 24:
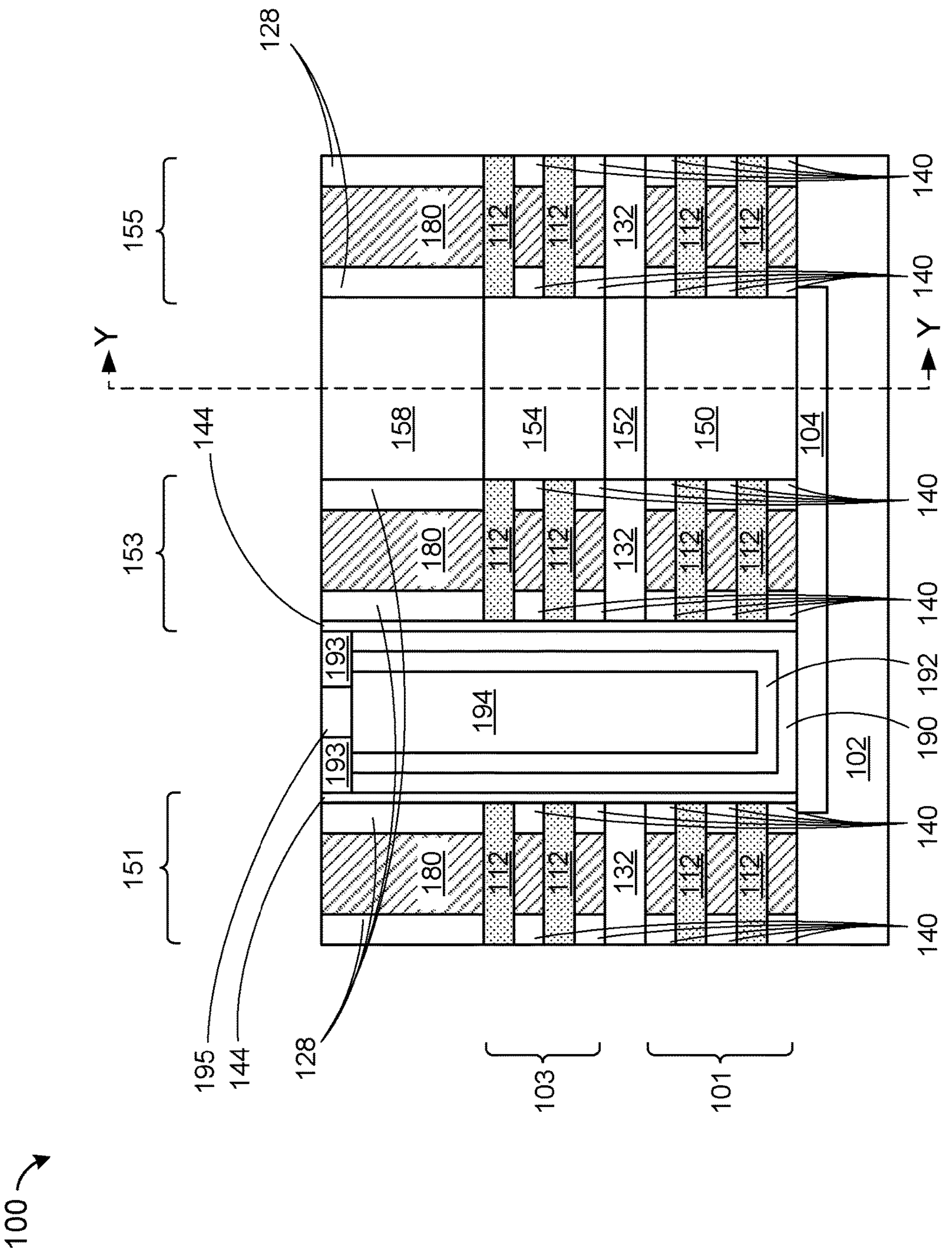
FIGS. 24 and 25 each illustrate a cross-sectional view of the semiconductor structure, along section lines X-X and Y-Y, respectively, and illustrates formation of an inner plate metal, according to an exemplary embodiment.
Figure 25:
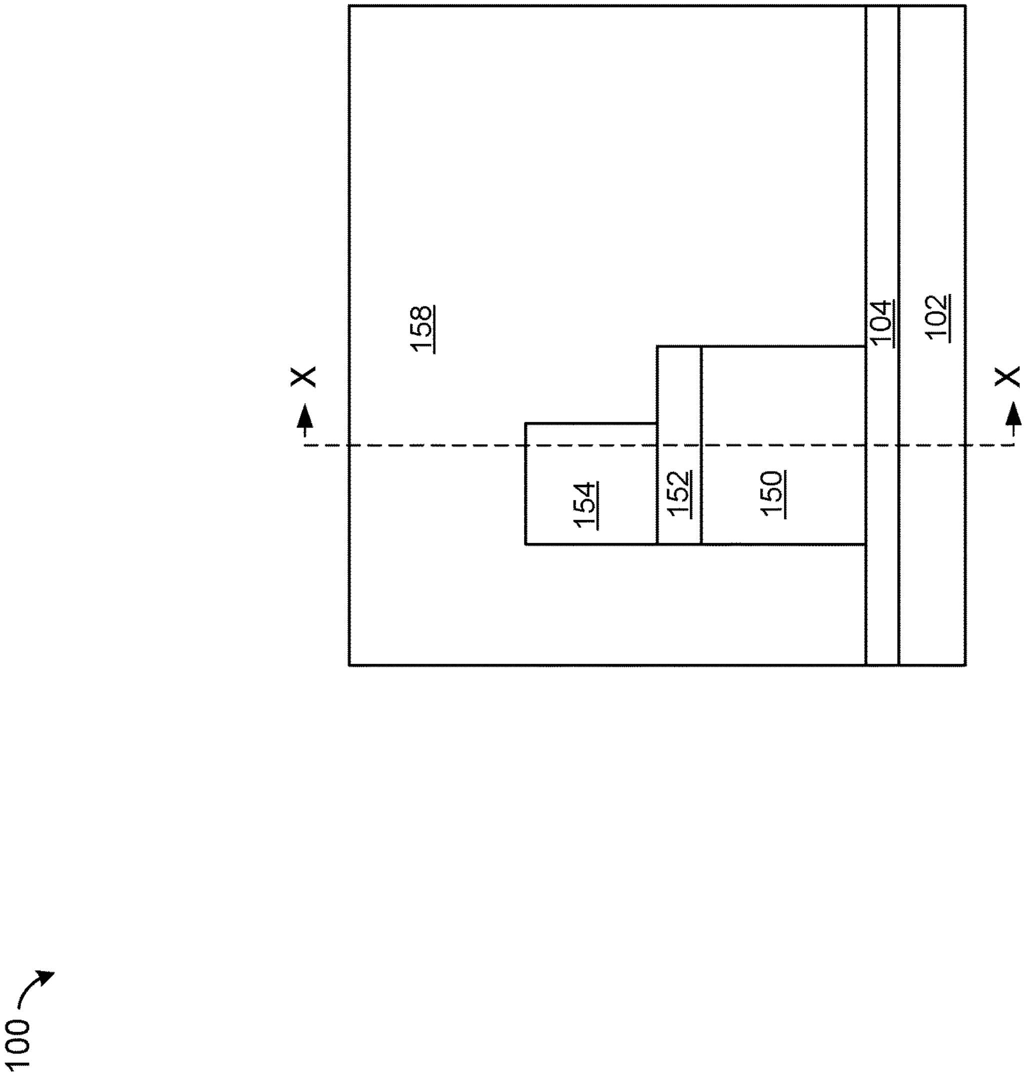

Referring now to FIGS. 24 and 25, the structure 100 is shown according to an exemplary embodiment. FIG. 25 is a cross-sectional view of the structure 100 along section line X-X. FIG. 25 is a cross-sectional view of the structure 100 along section line Y-Y. FIGS. 24 and 25 are perpendicular to each other. An inner plate metal 195 may be formed.

The inner plate metal 195 may be formed in remaining portions of the trench 197. The inner plate metal 195 may be formed as described for the outer plate 190. The inner plate metal 195 may provide a contact to the inner plate 190 of the MIM capacitor.

The inner plate metal 195 provides a first contact to the inner plate 194 of the MIM capacitor from an upper portion of the structure 100. Subsequent steps provide a second contact to the outer plate 190 of the MIM capacitor.

A planarization process, such as, for example, chemical mechanical polishing (CMP), may be done to remove excess material from an upper horizontal surface of the structure 100 such that upper horizontal surfaces of the inner plate metal 195, the dielectric spacer 193, the insulator 144, the replacement gate 180, the gate side spacer 128, and the ILD 158 are coplanar.

The insulator 144 protects the nanosheet stacks 151, 153 from the MIM capacitor.

Figure 26:
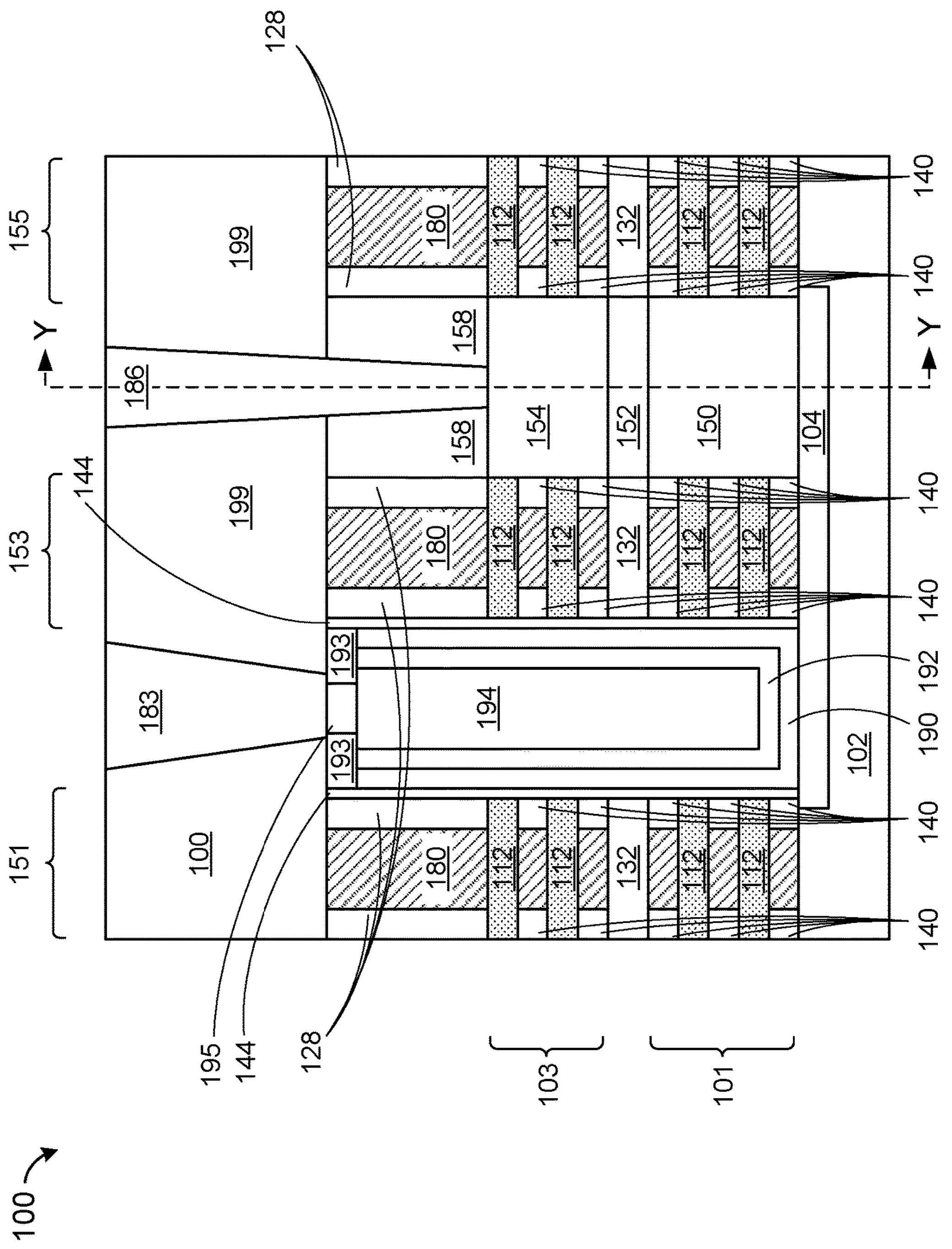
FIGS. 26 and 27 each illustrate a cross-sectional view of the semiconductor structure along section lines X-X and Y-Y, respectively, and illustrates formation of an inter-layer dielectric, and a contact, according to an exemplary embodiment.
Figure 27:
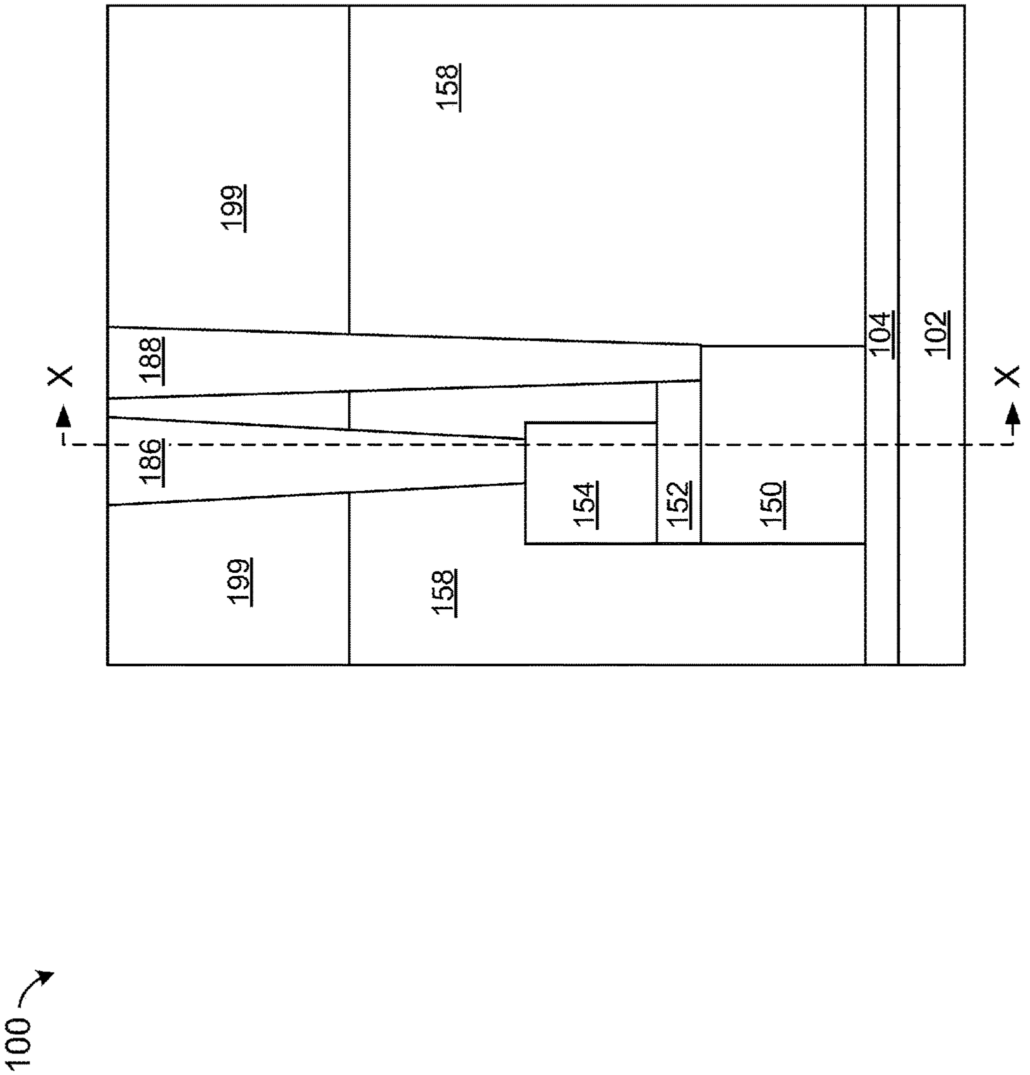

Referring now to FIGS. 26 and 27, the structure 100 is shown according to an exemplary embodiment. FIG. 26 is a cross-sectional view of the structure 100 along section line X-X. FIG. 27 is a cross-sectional view of the structure 100 along section line Y-Y. FIGS. 26 and 27 are perpendicular to each other. An inter-layer dielectric (hereinafter "ILD") 199 may be formed, a contact 183, a contact 186 and a contact 188 may be formed.

The ILD 199 may be formed as described for the ILD 152, directly on an upper horizontal surface of the inner plate 194, the dielectric spacer 193, the insulator 144, the replacement gate 180, the gate side spacer 128, and the ILD 158. A planarization process, such as, for example, chemical mechanical polishing (CMP), may be done to remove excess material of the ILD 199 from an upper horizontal surface of the structure 100.

Openings (not shown) may be formed in the ILD 160. The contact 183 may be formed in an opening which exposes an upper horizontal surface of the inner plate metal 195, forming the first contact to the inner plate 194 of the MIM capacitor. The contact 186 may be formed in an opening which exposes an upper horizontal surface of the upper source drain 154. The contact 188 may be formed in an opening which exposes an upper horizontal surface of the lower source drain 150.

In an embodiment, the contacts 183, 186, 188 are formed from a conductive material layer which is blanket deposited on top of the structure 100, and directly on an upper horizontal surface of the ILD 199, filling the openings (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The contacts 183, 186, 188 are formed by damascene, or patterned from the conductive material layer, using known patterning and etching techniques. A liner (not shown) may first be formed in the openings (not shown). There may be any number of openings and trenches in the ILD 199, each filled with the contacts 183, 186, 188 on the structure 100.

A planarization process, such as, for example, chemical mechanical polishing (CMP), may be done to remove excess material from an upper horizontal surface of the structure 100 such that upper horizontal surfaces of the contacts 183, 186, 188 and the ILD 199 are coplanar. The contacts 183, 186, 188 may be further connected to top layer wiring of the structure 100.

The MIM capacitor has the first contact or first electrode or first terminal to the inner plate 194, through the contact 183 and the inner plate 194. The MIM capacitor has a second contact or second electrode or second terminal. This may be through the contact 186 to the upper source drain 154, or alternatively through the contact 188 to the lower source drain 150.

The resulting MIM capacitor is placed adjacent to normal function circuitry of the structure 100, specifically next to two double stacked nanosheet FETs. The MIM capacitor is at a same level as the nanosheet FETs, at a same height above the substrate 102. A height of the MIM capacitor is greater than a combined height of the stacked nanosheet FETs of the lower nanosheet stack 101 and the upper nanosheet stack 103.

Figure 28:
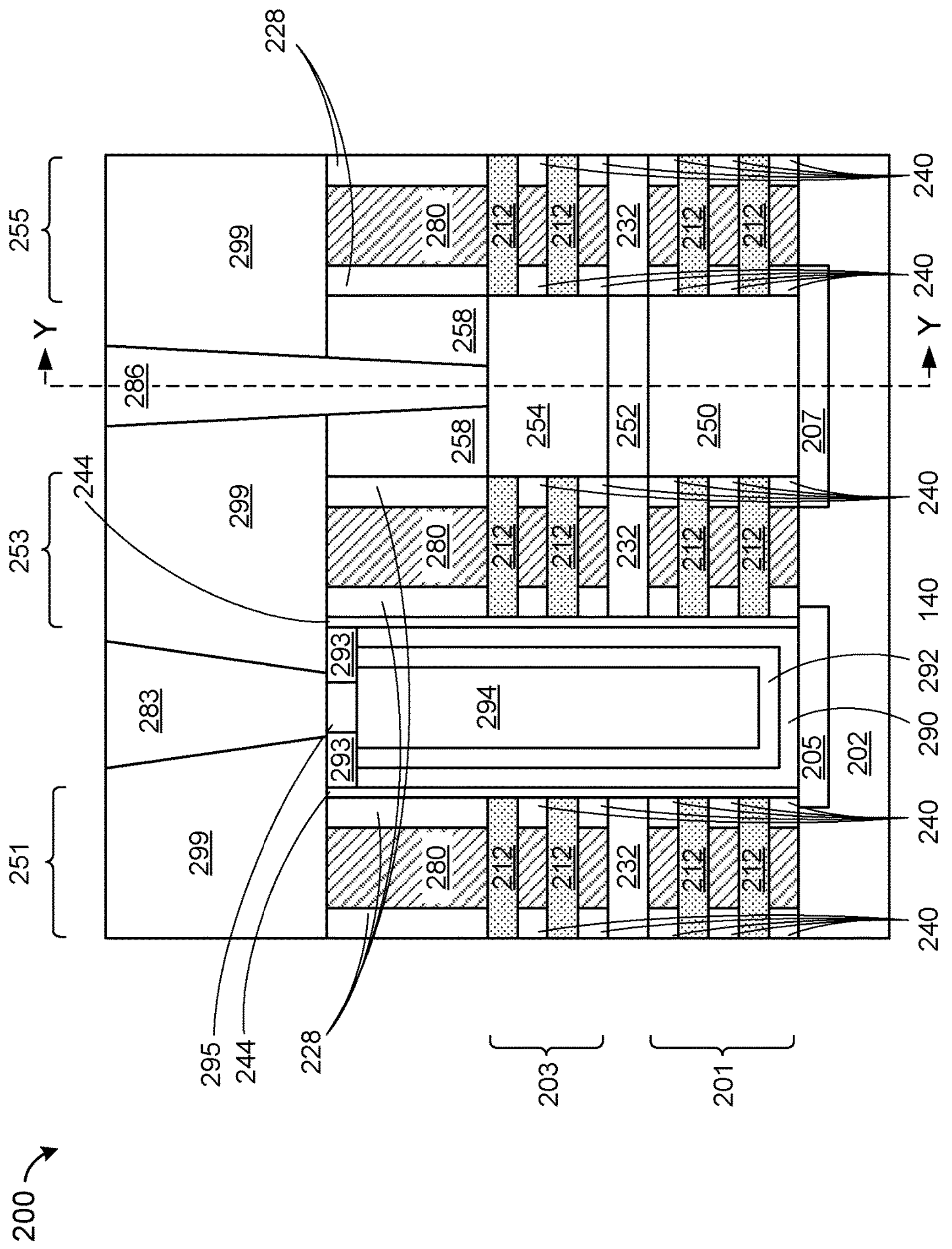
FIGS. 28 and 29 each illustrate a cross-sectional view of a second semiconductor structure at an intermediate stage of fabrication, along section lines X-X and Y-Y, respectively, according to an exemplary embodiment.
Figure 29:
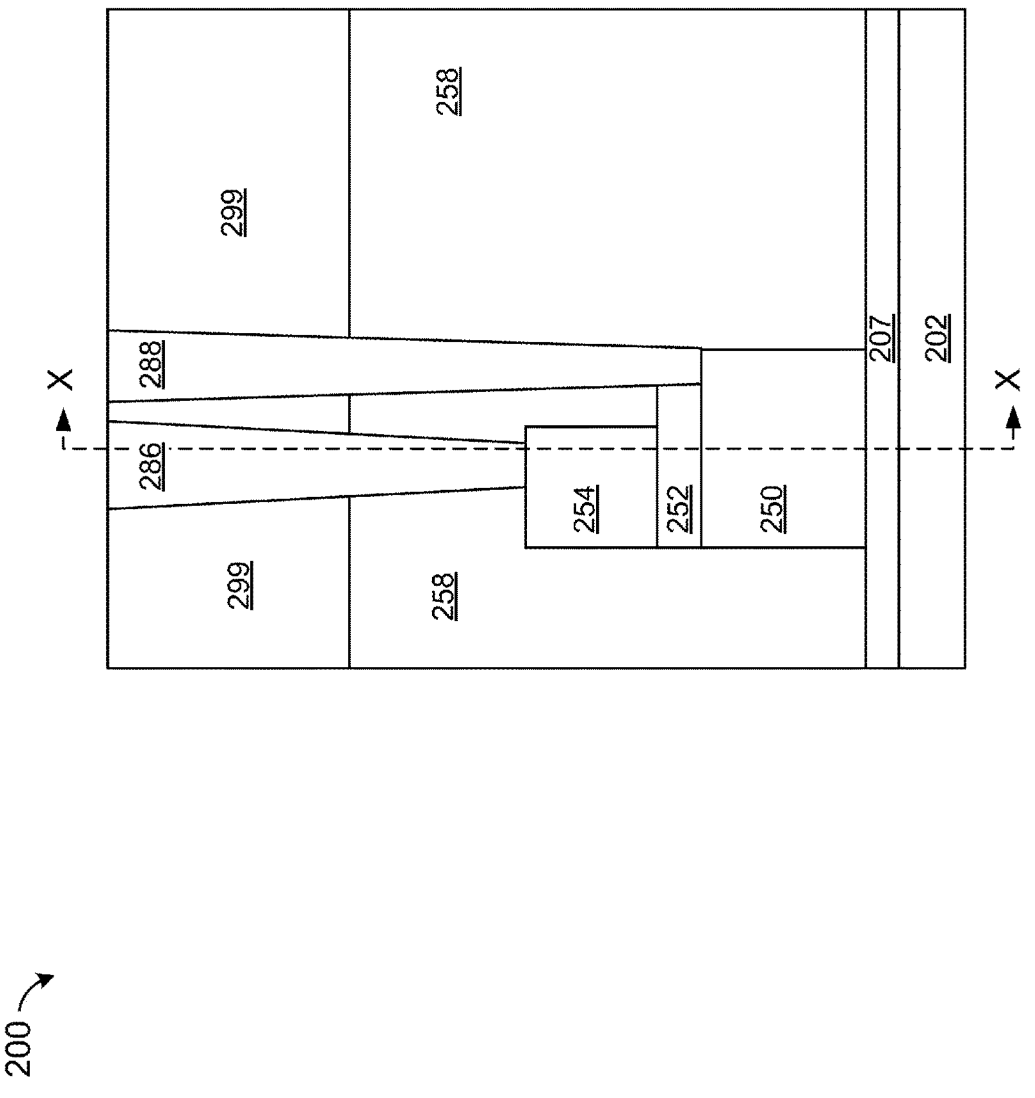

Referring now to FIGS. 28 and 29, a semiconductor structure 200 (hereinafter "structure") at an intermediate stage of fabrication is shown according to an exemplary embodiment. FIG. 28 is a cross-sectional view of the structure 200 along section line X-X. FIG. 29 is a cross-sectional view of the structure 200 along section line Y-Y. FIGS. 28 and 29 are perpendicular to each other. The structure 200 may be formed or provided.

The structure 200 is similar to the structure 100. Items with similar names may be formed as described for the structure 100. The structure 200 does not have the N-well 104. The structure 200 has a placeholder 205 and an etch stop layer 207.

The structure 200 includes a substrate 202, a lower nanosheet stack 201, an upper nanosheet stack 203, channel layers 212, side spacers 240, a middle dielectric isolation layer 232, a nanosheet stack 251, a nanosheet stack 253, a nanosheet stack 255, an insulator 244, a replacement gate 280, a gate side spacer 228, a lower source drain 250, an ILD 252, an upper source drain 254, an ILD 258, an ILD 299, a contact 283, a contact 286, a contact 288, an outer electrode 290, an insulator 292, a dielectric spacer 293, an inner plate 294 and an inner plate metal 195.

The placeholder 205 is embedded in the substrate 202. The etch stop layer 207 is embedded in the substrate 202. The placeholder 205 and the etch stop layer 207 may each be embedded in the substrate prior to the formation of the layers of the nanosheet stack.

The placeholder 205 may be formed below a portion of the subsequently formed nanosheet stack 251, below a trench (not shown) between the nanosheet stacks 251,253, and below a portion of the subsequently formed nanosheet stack 253. In an embodiment, the placeholder 205 is silicon germanium and may be a different material of the channel layers 212 and sacrificial layers (not shown), and other items of the structure 200, to allow selective etching of select items of the structure 200. The MIM capacitor may be formed directly on the place holder in the trench (not shown) between the nanosheet stacks 251, 253.

The etch stop layer 207 may be formed may be formed below a trench (not shown) between the nanosheet stacks 253,254, and below the subsequently formed lower source drain 250. The etch stop layer 207 may provide protection of the lower source drain 250 during subsequent processing steps.

Figure 30:
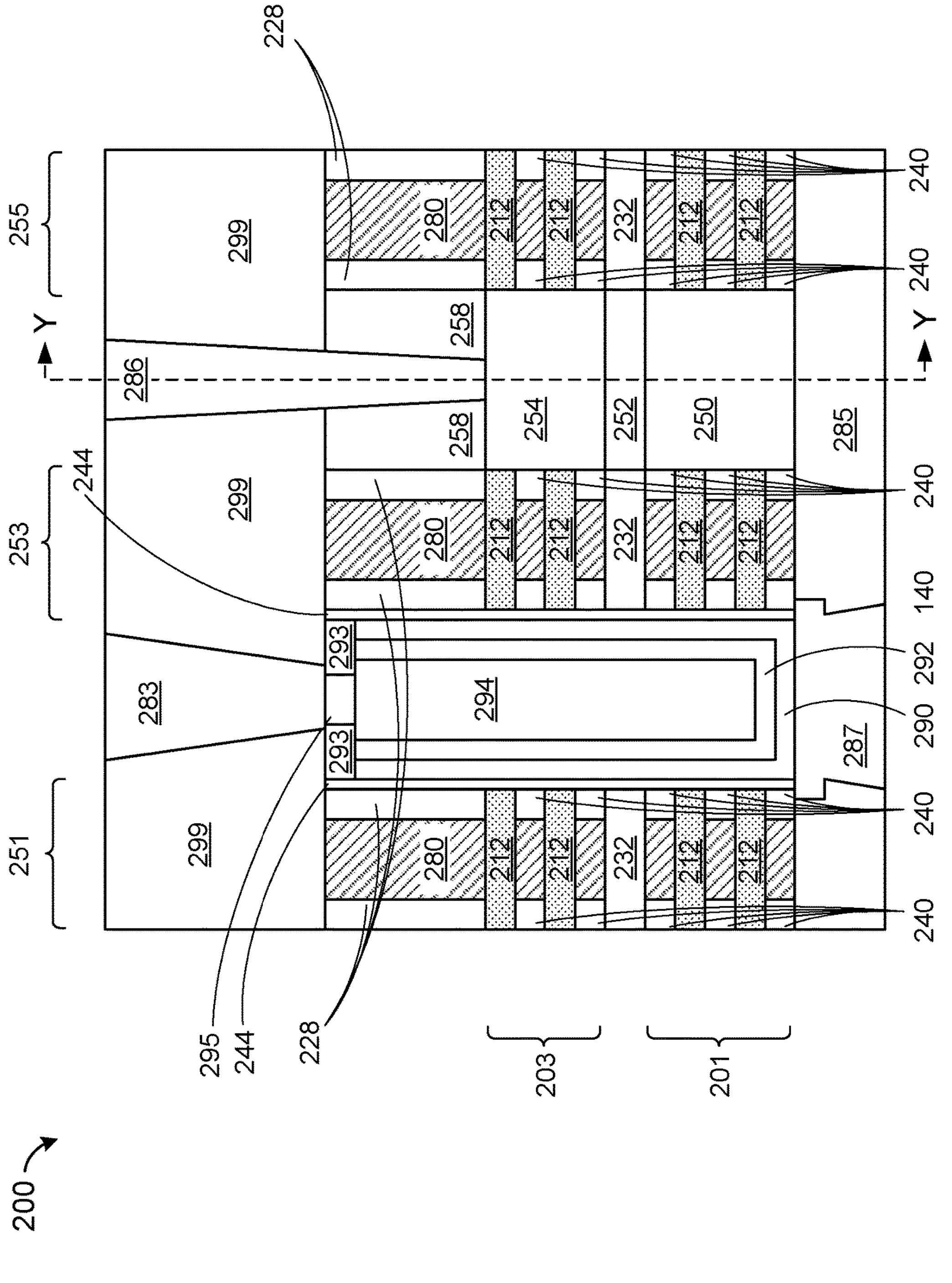
FIGS. 30 and 31 each illustrate a cross-sectional view of the second semiconductor structure, along section lines X-X and Y-Y, respectively, and illustrates formation of a backside contact, according to an exemplary embodiment.
Figure 31:
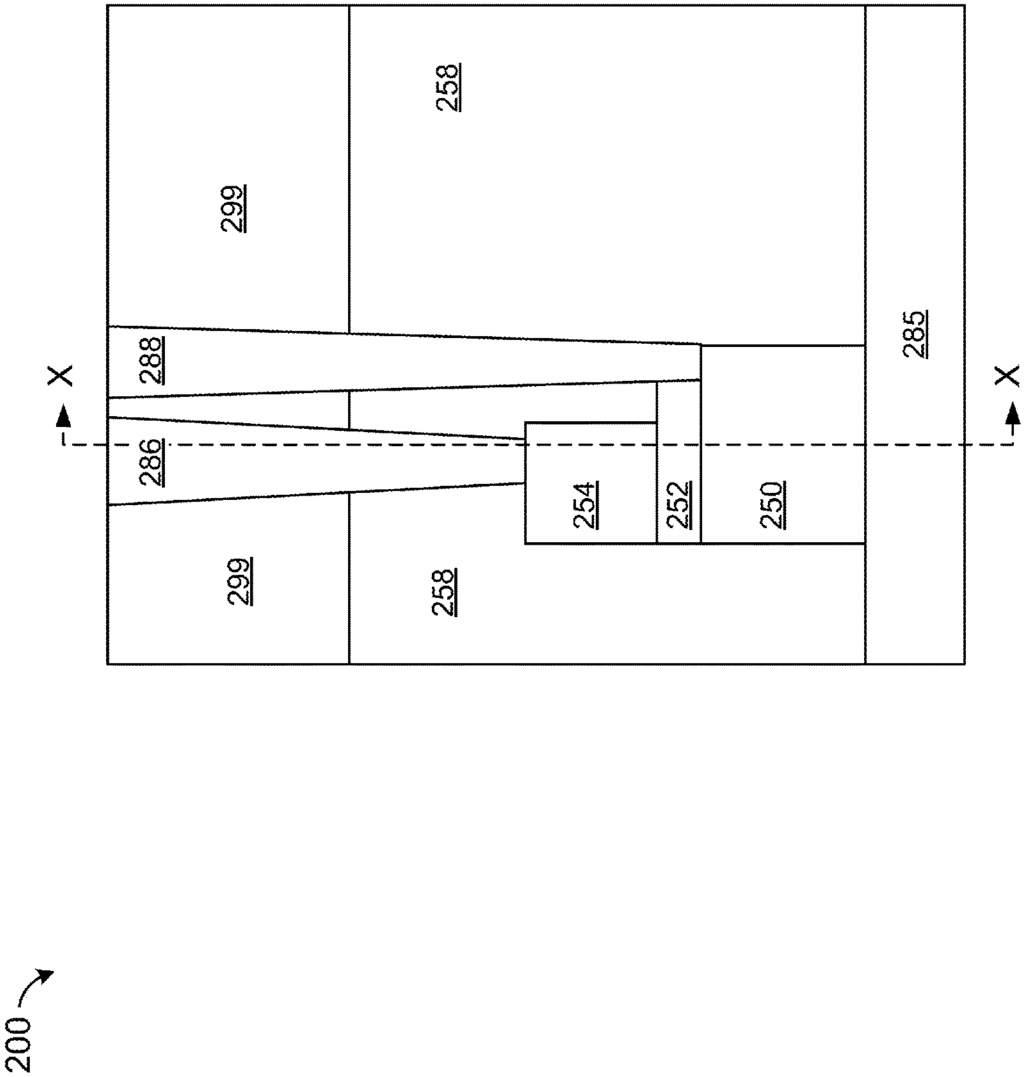

Referring now to FIGS. 30 and 31, the structure 200 is shown according to an exemplary embodiment. FIG. 30 is a cross-sectional view of the structure 200 along section line X-X. FIG. 31 is a cross-sectional view of the structure 200 along section line Y-Y. FIGS. 30 and 31 are perpendicular to each other. Backside processing may be performed on the structure 200. The substrate 202 may be removed. The etch stop layer 207 may be removed. The placeholder 205 may be removed. An ILD 285 may be formed. A backside contact 287 may be formed.

Several steps may be performed to the structure 200, including attaching a carrier wafer to an upper surface of the structure 200 and flipping the structure 200 over to perform process steps to a lower surface of the structure 200. The substrate 202 may be removed by methods known in the arts. The etch stop layer 207 may be removed by methods known in the arts. The placeholder 205 may be removed by methods known in the arts.

The ILD 285 may be formed as described for the ILD 152. The contact 287 may be formed in an opening (not shown) in the ILD 152 and where the placeholder 205 was removed. The contact 287 is a contact to the outer electrode 290. The contact 287 may be connected to subsequently formed backside wiring of the structure 200.

The resulting MIM capacitor is placed adjacent to normal function circuitry of the structure 200, specifically next to two double stacked nanosheet FETs. The MIM capacitor is at a same level as the nanosheet FETs, at a same height above the substrate 202. A height of the MIM capacitor is greater than a combined height of the stacked nanosheet FETs of the nanosheet stack 201 and the upper nanosheet stack 203. A first MIM contact is through the contact 283. A second MIM contact is through the contact 287 through a backside of the structure 200.

The insulator 244 physically and electrically separates the MIM capacitor from the stacked nanosheets 251, 253, and from the placeholder 205.

Figure 32:
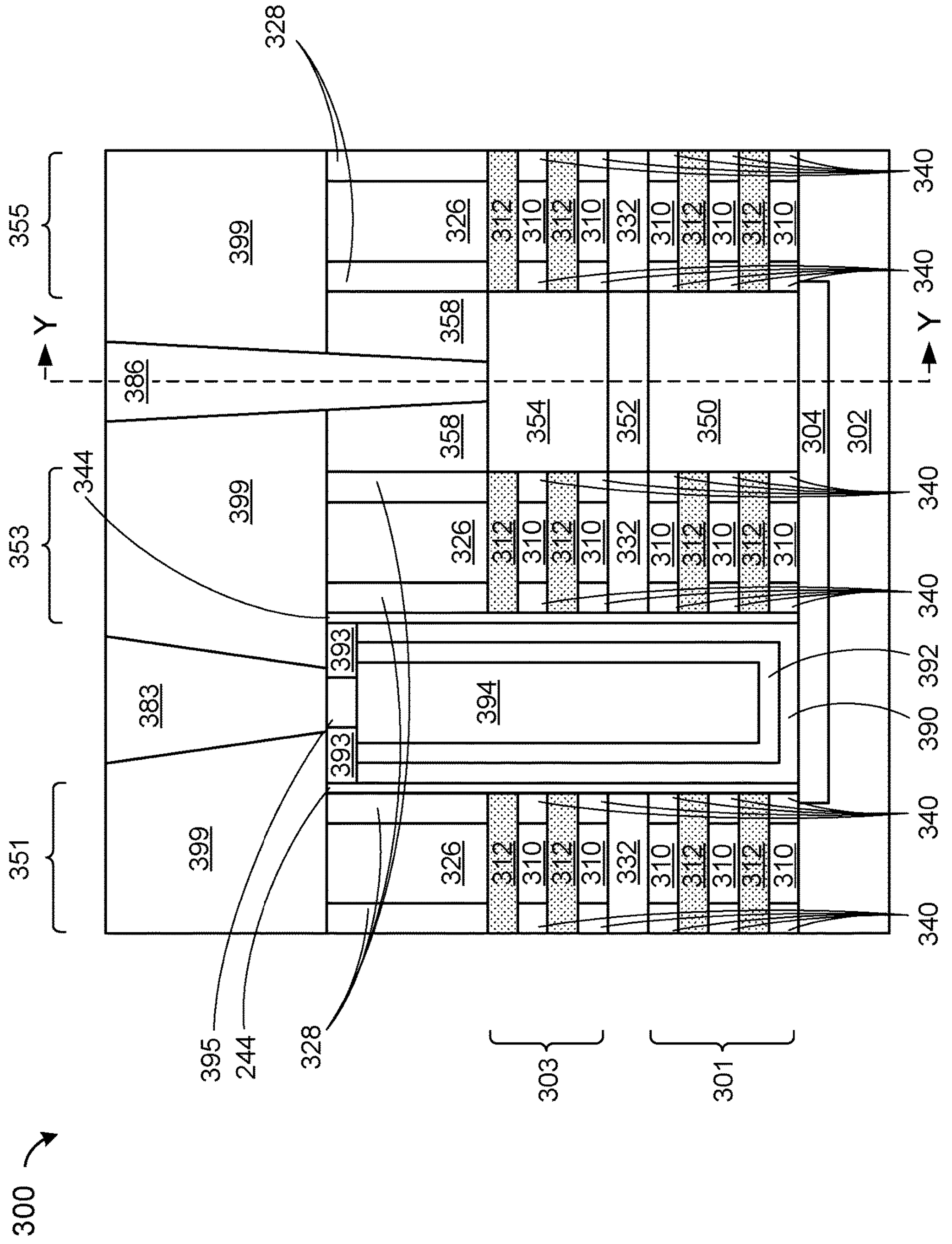
FIG. 32 illustrates a cross-sectional view of a third semiconductor structure at an intermediate stage of fabrication, along section lines X-X and Y-Y, respectively, according to an exemplary embodiment.

Referring now to FIG. 32, a semiconductor structure 300 (hereinafter "structure") at an intermediate stage of fabrication is shown according to an exemplary embodiment. FIG. 32 is a cross-sectional view of the structure 300 along section line X-X. The structure 300 may be formed or provided.

The structure 300 is similar to the structure 100. Items with similar names may be formed as described for the structure 100. The structure 300 does not have the replacement gate 180. The structure 300 does have a sacrificial gate 326 and sacrificial layers 310.

The structure 300 includes a substrate 302, an N-well 304, a lower nanosheet stack 301, an upper nanosheet stack 303, channel layers 312, side spacers 340, a middle dielectric isolation layer 332, a nanosheet stack 351, a nanosheet stack 353, a nanosheet stack 355, an insulator 344, a gate side spacer 328, a lower source drain 350, an ILD 352, an upper source drain 354, an ILD 358, an ILD 399, a contact 386, a contact 388, an outer electrode 390, an insulator 392, a dielectric spacer 393, an inner plate 394 and an inner plate metal 395

During fabrication of the structure 300, the steps of removing the sacrificial gate 326 and removing the sacrificial layers 310, as included in the description of FIGS. 12 and 13, are not performed. The fabrication of the structure 300 continues with the formation of the MIM capacitor. The structure 300 is an alternate method of forming a MIM capacitor. In an alternative embodiment, a replacement gate may be formed in one or two of the nanosheet stacks 351, 353, 355. For example, the nanosheet stack 355 may have a replacement gate rather than the sacrificial gate 326 and the sacrificial layers 310, and be a normal function nanosheet double stacked FET.

The insulator 344 physically and electrically separates the MIM capacitor from the stacked nanosheets 351, 353, and from the N-well 304.

Figure 33:
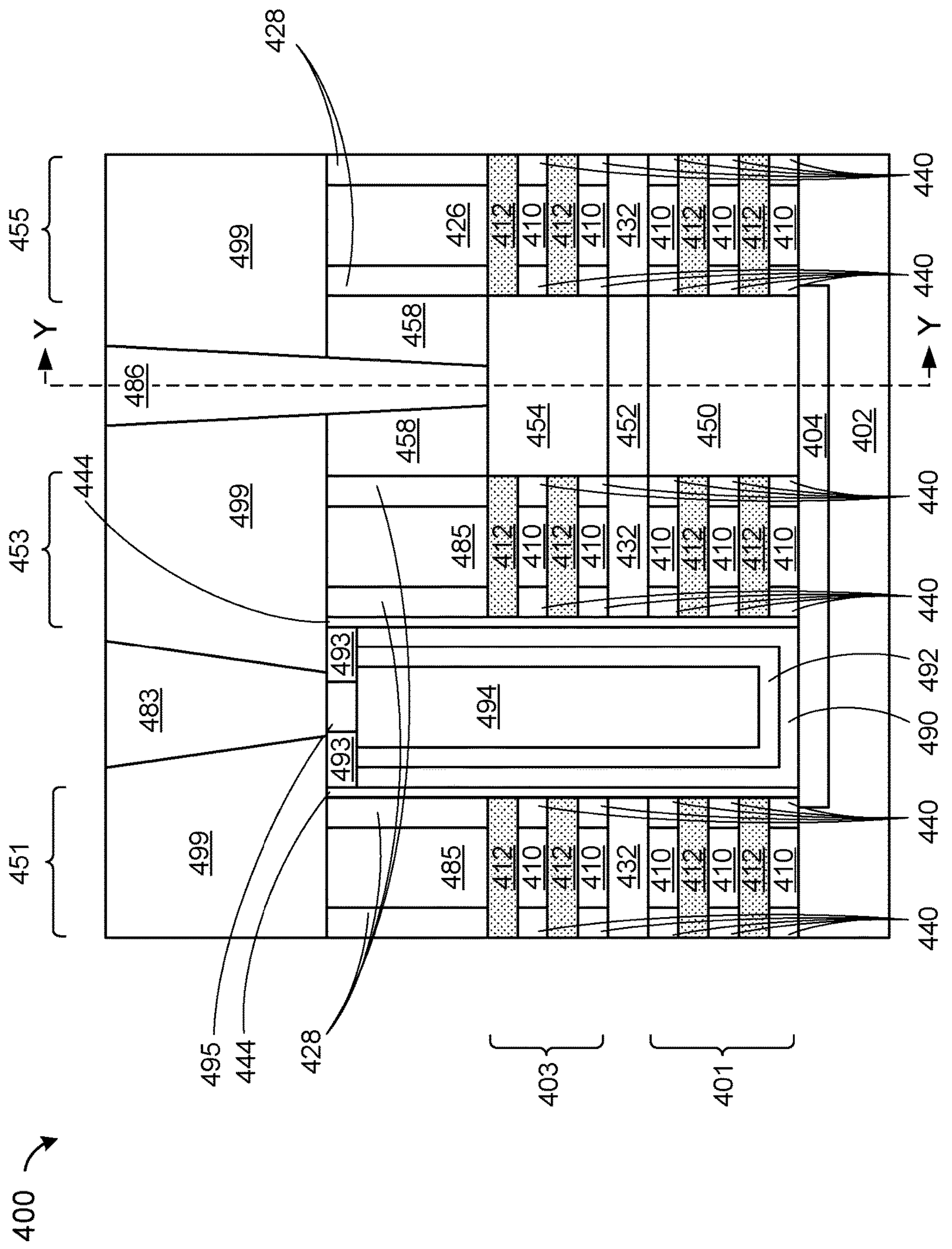
FIG. 33 illustrates a cross-sectional view of a fourth semiconductor structure at an intermediate stage of fabrication, along section lines X-X and Y-Y, respectively, according to an exemplary embodiment.

Referring now to FIG. 33, a semiconductor structure 400 (hereinafter "structure") at an intermediate stage of fabrication is shown according to an exemplary embodiment. FIG. 33 is a cross-sectional view of the structure 400 along section line X-X. The structure 400 may be formed or provided.

The structure 400 is similar to the structure 100. Items with similar names may be formed as described for the structure 100. The structure 400 does not have the replacement gate 180. The structure 400 does have a sacrificial gate 426 and sacrificial layers 410. The structure 400 has an insulator 485.

The structure 400 includes a substrate 402, an N-well 404, a lower nanosheet stack 401, an upper nanosheet stack 403, channel layers 412, side spacers 440, a middle dielectric isolation layer 432, a nanosheet stack 451, a nanosheet stack 453, a nanosheet stack 455, an insulator 444, a gate side spacer 428, a lower source drain 450, an ILD 452, an upper source drain 454, an ILD 458, an ILD 499, a contact 483, a contact 486, an outer electrode 490, an insulator 492, a dielectric spacer 493, an inner plate 494 and an inner plate metal 495.

During fabrication of the structure 400, the steps of removing the sacrificial gate 426 and removing the sacrificial layers 410, as included in the description of FIGS. 12 and 13, are not performed. The fabrication of the structure 400 continues with removal of the sacrificial gate 426 in the nanosheet stacks 451 and 453. The insulator 485 may be formed where the sacrificial gate 426 was removed in the nanosheet stacks 451, 453. The fabrication of the structure 400 continues with the formation of the MIM capacitor. The structure 400 is an alternate method of forming a MIM capacitor. In an alternative embodiment, a replacement gate may be formed in one or two of the nanosheet stacks 451, 453, 455. For example, the nanosheet stack 455 may have a replacement gate rather than the sacrificial gate 426 and the sacrificial layers 410, and be a normal function nanosheet double stacked FET.

The insulator 444 physically and electrically separates the MIM capacitor from the stacked nanosheets 451, 453, and from the N-well 404.

Figure 34:
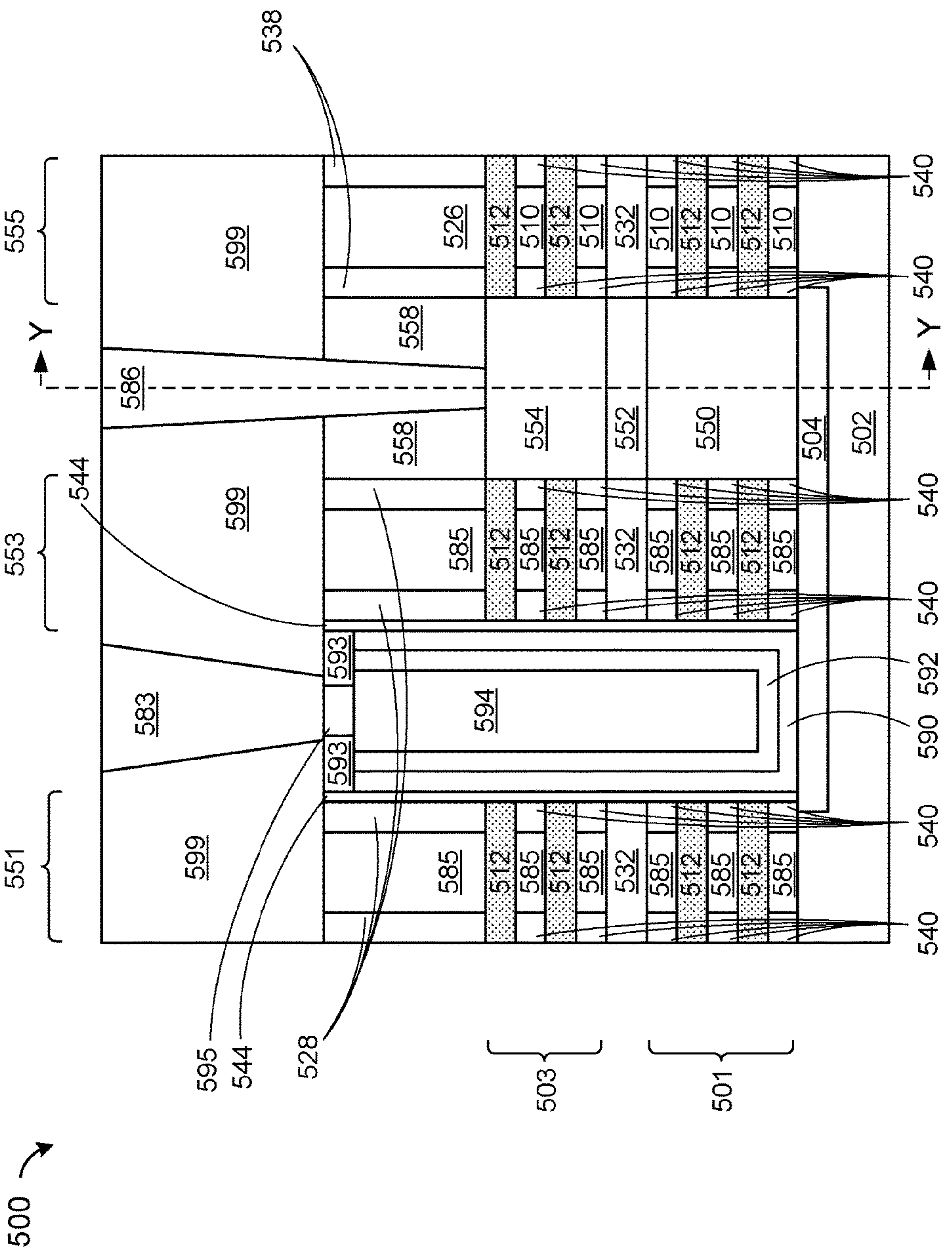
FIG. 34 illustrates a cross-sectional view of a fifth semiconductor structure at an intermediate stage of fabrication, along section lines X-X and Y-Y, respectively, according to an exemplary embodiment.

Referring now to FIG. 34, a semiconductor structure 500 (hereinafter "structure") at an intermediate stage of fabrication is shown according to an exemplary embodiment. FIG. 34 is a cross-sectional view of the structure 500 along section line X-X. The structure 500 may be formed or provided.

The structure 500 is similar to the structure 100. Items with similar names may be formed as described for the structure 100. The structure 400 does not have the replacement gate 180. The structure 500 does have a sacrificial gate 426 and sacrificial layers 410. The structure 500 has an insulator 585.

The structure 500 includes a substrate 502, an N-well 504, a lower nanosheet stack 501, an upper nanosheet stack 503, channel layers 512, side spacers 540, a middle dielectric isolation layer 532, a nanosheet stack 551, a nanosheet stack 553, a nanosheet stack 555, an insulator 544, a gate side spacer 528, a lower source drain 550, an ILD 552, an upper source drain 554, an ILD 558, an ILD 599, a contact 583, a contact 586, an outer electrode 590, an insulator 592, a dielectric spacer 593, an inner plate 594 and an inner plate metal 595.

During fabrication of the structure 500, the steps of removing the sacrificial gate 526 and removing the sacrificial layers 510, as included in the description of FIGS. 12 and 13, may be performed for the nanosheet stacks 551, 553. The steps of removal of the sacrificial gate 526 and the sacrificial layers 510 may not be performed for the nanosheet stack 555. The fabrication of the structure 500 continues with formation of the insulator 585 where the sacrificial gate 526 and the sacrificial layers 510 were removed in the nanosheet stacks 551, 553. The fabrication of the structure 500 continues with the formation of the MIM capacitor. The structure 500 is an alternate method of forming a MIM capacitor. In an alternative embodiment, a replacement gate may be formed in one or two of the nanosheet stacks 551, 553, 555. For example, the nanosheet stack 555 may have a replacement gate rather than the sacrificial gate 526 and the sacrificial layers 510, and be a normal function nanosheet double stacked FET.

The insulator 544 physically and electrically separates the MIM capacitor from the stacked nanosheets 551, 553, and from the N-well 504.

Alternate methods of forming a MIM capacitor adjacent to nanosheet FETs have been described. Any combination of the different embodiments may be combined in formation of a MIM capacitor, for example, forming a backside contact to the outer plate 190.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:

a first stacked nanosheet transistor adjacent to a second stacked nanosheet transistor;

a metal-insulator-metal capacitor between the first stacked nanosheet transistor and the second stacked nanosheet transistor; and an insulator layer separating the metal-insulator-metal capacitor from each of the first stacked nanosheet transistor and the second stacked nanosheet transistor.

2. The semiconductor device according to claim 1, further comprising:

a contact below the second stacked nanosheet transistor connecting a first electrode of the metal-insulator-metal capacitor and a lower source drain of the second stacked nanosheet transistor.

3. The semiconductor device according to claim 1, further comprising:

a contact above the metal-insulator-metal capacitor and in electrical contact with an inner plate of the metal-insulator-metal capacitor.

4. The semiconductor device according to claim 1, wherein the insulator layer directly contacts both first channels of the first stacked nanosheet transistor and second channels of the second stacked nanosheet transistor.

5. The semiconductor device according to claim 1, wherein the metal-insulator-metal capacitor comprises an outer plate and an inner plate separated by an insulator layer.

6. The semiconductor device according to claim 1, wherein a topmost surface of the insulator layer is above a topmost surface of the metal-insulator-metal capacitor.

7. The semiconductor device according to claim 1, wherein a topmost surface of the metal-insulator-metal capacitor is below a topmost surface of a first gate of the first stacked nanosheet transistor.

8. A semiconductor device comprising:

a first stacked nanosheet transistor comprising a first upper transistor and a first lower transistor separated by a middle dielectric isolation layer;

a second stacked nanosheet transistor comprising a second upper transistor and a second lower transistor separated by the middle dielectric isolation layer;

a metal-insulator-metal capacitor between the first stacked nanosheet transistor and the second stacked nanosheet transistor; and an insulator layer separating the metal-insulator-metal capacitor from each of the first stacked nanosheet transistor and the second stacked nanosheet transistor.

9. The semiconductor device according to claim 8, further comprising:

a contact below the second stacked nanosheet transistor connecting a first electrode of the metal-insulator-metal capacitor and a lower source drain of the second stacked nanosheet transistor.

10. The semiconductor device according to claim 8, further comprising:

a contact above the metal-insulator-metal capacitor and in electrical contact with an inner plate of the metal-insulator-metal capacitor.

11. The semiconductor device according to claim 8, wherein the insulator layer directly contacts both first channels of the first stacked nanosheet transistor and second channels of the second stacked nanosheet transistor.

12. The semiconductor device according to claim 8, wherein the metal-insulator-metal capacitor comprises an outer plate and an inner plate separated by an insulator layer.

13. The semiconductor device according to claim 8, wherein a topmost surface of the insulator layer is above a topmost surface of the metal-insulator-metal capacitor.

14. The semiconductor device according to claim 8, wherein a topmost surface of the metal-insulator-metal capacitor is below a topmost surface of a first gate of the first stacked nanosheet transistor.

15. A method comprising:

forming a first stacked nanosheet transistor adjacent to a second stacked nanosheet transistor;

forming a metal-insulator-metal capacitor between the first stacked nanosheet transistor and the second stacked nanosheet transistor; and forming an insulator layer separating the metal-insulator-metal capacitor from each of the first stacked nanosheet transistor and the second stacked nanosheet transistor.

16. The method according to claim 15, further comprising:

forming a contact below the second stacked nanosheet transistor connecting a first electrode of the metal-insulator-metal capacitor and a lower source drain of the second stacked nanosheet transistor.

17. The method according to claim 15, further comprising:

forming a contact above the metal-insulator-metal capacitor and in electrical contact with an inner plate of the metal-insulator-metal capacitor.

18. The method according to claim 15, wherein the insulator layer directly contacts both first channels of the first stacked nanosheet transistor and second channels of the second stacked nanosheet transistor.

19. The method according to claim 15, wherein a topmost surface of the insulator layer is above a topmost surface of the metal-insulator-metal capacitor.

20. The method according to claim 15, wherein a topmost surface of the metal-insulator-metal capacitor is below a topmost surface of a first gate of the first stacked nanosheet transistor.

* * * * *